United States Patent
Oh et al.

(10) Patent No.: US 10,560,128 B2
(45) Date of Patent: Feb. 11, 2020

(54) CARRIER AGGREGATED SIGNAL TRANSMISSION AND RECEPTION

(71) Applicant: SAMSUNG ELECTRONICS CO., LTD., Suwon-si, Gyeonggi-Do (KR)

(72) Inventors: Seung-hyun Oh, Seoul (KR); Chilun Lo, Seongnam-si (KR); Barosaim Sung, Daejeon (KR); Jae-hoon Lee, Suwon-si (KR); Jong-woo Lee, Seoul (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 16/203,943

(22) Filed: Nov. 29, 2018

(65) Prior Publication Data

US 2019/0173501 A1    Jun. 6, 2019

(30) Foreign Application Priority Data

Dec. 5, 2017   (KR) .......................... 10-2017-0166194
Aug. 2, 2018   (KR) .......................... 10-2018-0090411

(51) Int. Cl.
*H04B 1/00*   (2006.01)
*H03L 7/08*   (2006.01)
*H04L 27/26*  (2006.01)

(52) U.S. Cl.
CPC .............. *H04B 1/0057* (2013.01); *H03L 7/08* (2013.01); *H04B 1/0028* (2013.01); *H04L 27/2649* (2013.01)

(58) Field of Classification Search
CPC ..... H03L 7/00; H03L 7/06; H03L 7/08; H03L 7/085; H03L 7/093; H03L 7/099; H03M 1/12; H03M 1/124; H04B 1/00; H04B 1/16; H04B 1/26; H04B 1/38; H04B 1/0028; H04B 1/0057; H04B 1/7097; H04B 7/00; H04B 7/216; H04B 17/21; H04J 1/00; H04J 1/08; H04L 5/08; H04L 5/14;
(Continued)

(56) References Cited

U.S. PATENT DOCUMENTS 6,314,145 B1 *  11/2001  van Driest .......... H04L 27/2332
                                                          375/326
6,871,052 B2 *  3/2005   Spencer .............. H04B 7/0811
                                                          455/226.2
(Continued)

*Primary Examiner* — Shawkat M Ali
(74) *Attorney, Agent, or Firm* — F. Chau & Assocaites, LLC

(57) ABSTRACT

Provided are a radio-frequency integrated chip (RFIC) and a wireless communication device including the RFIC. An RFIC configured to receive a carrier aggregated receive signal having at least first and second carrier signals may include first and second carrier receivers configured to generate, from the receive signal, first and second digital carrier signals, respectively. A phase-locked loop (PLL) may output a first frequency signal having a first frequency to the first carrier receiver and the second carrier receiver. The first and second carrier receivers may include first and second analog mixers, respectively, for translating frequencies of the receive signal, using the first frequency signal and the second frequency signal, respectively. Each of the first and second carrier receivers may further include a digital mixer for farther translating the frequencies of the receive signal in the digital domain.

20 Claims, 19 Drawing Sheets

(58) Field of Classification Search
CPC ......... H04L 27/00; H04L 27/14; H04L 27/22;
H04L 27/26; H04L 27/2649; H04W 88/06
USPC ........ 327/119, 149, 159; 370/277, 297, 342,
370/343, 516; 375/144, 219, 260, 262,
375/267, 295, 316, 319, 327, 354;
455/75, 118, 164.1, 318, 507
See application file for complete search history.

(56) References Cited

U.S. PATENT DOCUMENTS

| | | | |
|---|---|---|---|
| 2002/0025778 A1* | 2/2002 | Lee ................. | H04W 88/06 455/3.05 |
| 2004/0224654 A1* | 11/2004 | Javor ................. | H04B 1/30 455/146 |
| 2010/0091688 A1* | 4/2010 | Staszewski .......... | H03D 7/1441 370/277 |
| 2013/0336368 A1* | 12/2013 | Arima .................. | H04B 1/7097 375/144 |
| 2014/0341097 A1 | 11/2014 | Gomez et al. | |
| 2015/0180523 A1* | 6/2015 | Tasic .................. | H04B 1/26 375/316 |
| 2015/0222464 A1 | 8/2015 | Liu et al. | |
| 2015/0311908 A1 | 10/2015 | Laaja et al. | |
| 2015/0333815 A1 | 11/2015 | Leung et al. | |
| 2016/0072512 A1 | 3/2016 | Khalili et al. | |
| 2016/0182094 A1 | 6/2016 | Hadji-Abdolhamid et al. | |
| 2016/0294591 A1 | 10/2016 | Kurchuk et al. | |

* cited by examiner

CARRIER AGGREGATED SIGNAL TRANSMISSION AND RECEPTION

CROSS-REFERENCE TO RELATED APPLICATIONS

This application claims the benefit of Korean Patent Application Nos. 10-2017-0166194 and 10-2018-0090411, respectively filed on Dec. 5, 2017 and Aug. 2, 2018, in the Korean Intellectual Property Office, the disclosures of which are incorporated by reference in their entireties.

TECHNICAL FIELD

The inventive concept relates generally to a radio-frequency integrated chip (RFIC) and a wireless communication device, and more particularly, to an RFIC configured to transceive signals using carrier aggregation and a wireless communication device including the RFIC.

DISCUSSION OF RELATED ART

Carrier aggregation (CA) refers to the aggregation of a plurality of carrier waves ("carriers") on a single transmission path for the transmission of signals between wireless communication devices. A frequency range of signal energy transmitted via one modulated carrier may be referred to as a frequency channel. Using CA, a wireless device may transmit/receive a larger amount of data over a given wireless channel encompassing multiple frequency channels, by concurrently processing, multiple carriers that may each carry respective data.

With CA, frequency channels over which data is transmitted may be variously arranged. A CA capable transmitter, receiver, or transceiver of a wireless communication device may be comprised of multiple single-carrier receivers, transmitters or transceivers (herein called "carrier transmitters", "carrier receivers", or "carrier transceivers") which are designed to support various arrangements of the frequency channels.

In addition, a phase-locked loop (PLL) configured to support a fixed frequency may be utilized so that a plurality of carrier transmitters and/or carrier receivers may process information signals. With many current designs, since a plurality of carrier transmitters and carrier receivers use individual PLLs, a large area for the PLLs is occupied in a chip, and power consumption of the PLLs is high.

SUMMARY

The inventive concept provides a radio-frequency integrated chip (RFIC) configured to support frequency signals for each of a plurality of carrier transmitters and a plurality of carrier receiver's using a single phase-locked loop (PLL), and a wireless communication device including the RFIC.

According to an aspect of the inventive concept, there is provided an RFIC configured to receive a receiving signal composed, of at least first and second carrier signals. The RFIC may include first and second carrier receivers and a PLL. The first carrier receiver is configured to receive a first portion of the receiving signal and generate therefrom a first digital carrier signal corresponding to the first carrier signal. The first carrier receiver includes a first analog mixer configured to translate frequencies of the first carrier signal in an analog domain and a first digital mixer configured to further translate frequencies of the first carrier signal in a digital domain and output the first digital carrier signal. The carrier receiver is configured to receive a second portion of the receiving signal and generate therefrom a second digital carrier signal corresponding to the second carrier signal. The second carrier receiver includes a second analog mixer configured to translate frequencies of the second carrier signal in an analog domain and a second digital mixer configured to further translate frequencies of the second carrier signal in the digital domain and output the second digital carrier signal. The PLL is configured to output a first frequency signal having a first frequency to each of the first and second carrier receivers. The first analog mixer translates the frequencies of the first carrier signal using a second frequency signal generated by dividing the first frequency signal, and the second analog mixer translates the frequencies of the second carrier signal using a third frequency signal generated by dividing the first frequency signal.

According to another aspect of the inventive concept, there is provided an RFIC configured to transmit a carrier aggregated signal. The RFIC includes first and second carrier transmitters and a phase-locked loop (PLL). The first carrier transmitter is configured to receive a first digital carrier signal and generate therefrom a first transmitting signal. The first carrier transmitter includes a first digital mixer configured to translate frequencies of the first digital carrier signal in a digital domain, and a first analog mixer configured to translate frequencies of a first analog carrier signal, derived from the first digital carrier signal, in an analog domain. The second carrier transmitter is configured to receive a second digital carrier signal and generate therefrom a second transmitting signal. The second carrier transmitter includes a second digital mixer configured to translate frequencies of the second digital carrier signal in the digital domain, and a second analog mixer configured to translate frequencies of a second analog carrier signal, derived from the second digital carrier signal, in the analog domain. The PLL is configured to output a first frequency signal having a first frequency to the first carrier transmitter and the second carrier transmitter. The first analog mixer up converts the frequencies of the first analog carrier signal using a second frequency signal generated by dividing the first frequency signal, and the second analog mixer up-converts the frequencies of the second analog carrier signal using a third frequency signal generated by dividing the first frequency signal.

According to another aspect of the inventive concept, there is provided a wireless communication device configured to receive a receive signal composed of at least first and second carrier signals. The wireless communication device may include an RFIC including a first carrier receiver configured to receive a first portion of the receive signal and generate therefrom a first digital carrier signal corresponding to the first carrier signal, a second carrier receiver configured to receive a second portion of the receive signal and generate therefrom a second digital carrier signal, a PLL configured to output a first frequency signal had in a first frequency to the first carrier receiver and the second carrier receiver, and a modulator-demodulator (MODEM) configured to down-convert frequencies of the first and second digital carrier signals in a digital domain and then demodulate the down-converted first and second digital carrier signals. The first carrier receiver includes a first analog mixer configured to down-convert frequencies of the receive signal using a second frequency signal generated based on the first frequency signal. The second carrier receiver includes a second analog mixer configured to down-convert the frequencies of the first receive signal using a third frequency signal generated based on the first frequency signal.

BRIEF DESCRIPTION OF THE DRAWINGS

Embodiments of the inventive concept will be more clearly understood from the following detailed description taken in conjunction with the accompanying drawings in which like reference characters indicate like elements or operations, wherein:

FIG. 15 is a block diagram of an RFIC according to an example embodiment;

DETAILED DESCRIPTION OF EMBODIMENTS

In the following description, the term "radio frequency integrated chip" (RFIC) refers to a chip (a small piece of semiconductor material) within which a plurality of circuit components are integrated, where at least some of the circuit components are operable at RF frequencies.

Herein, a "carrier aggregated signal" refers to a multi-carrier signal. The term "carrier receiver" refers to receiver circuitry for receiving and, processing signal energy associated with at least a single carrier within a carrier aggregated receive signal. A "carrier transmitter" refers to transmitter circuitry for processing and outputting, in a transmit path, signal energy associated with at least a single carrier of a carrier aggregated transmit signal. Processing in the transmit and receive paths may include amplifying, filtering, frequency translating, and D/A or A/D conversion.

Herein, a "mixed" signal may refer to a signal output by a mixer, which is frequency translated relative to an input signal to the mixer.

Herein, for brevity, any signal, voltage or other variable may be referred to interchangeably just by its previously introduced legend. For example, a "first analog receiving signal RS_A1" may be referred to as just "RS_1" or "signal RS_1"; a "first mixed receiving signal RS_M1" may be referred to as just "RS_M1" or "signal RS_M1"; etc. Similarly, a component partly identified with a legend and having a basic function, such as a filter or a mixer, but differentiated from other similar functioning components with augmented terms such as "first", "second", "receiving", "transmitting", etc., may, for brevity, be later called just its functional name+its legend. For instance, a "first analog receiving filter 114" may subsequently be called "filter 114"; a "first digital mixer 117" may be later called "mixer 117"; etc.

Herein, the terms "receiving signal" and "receive signal" will be used interchangeably. "Transmitting signal" and "transmit signal" will be used interchangeably.

Figure 1:
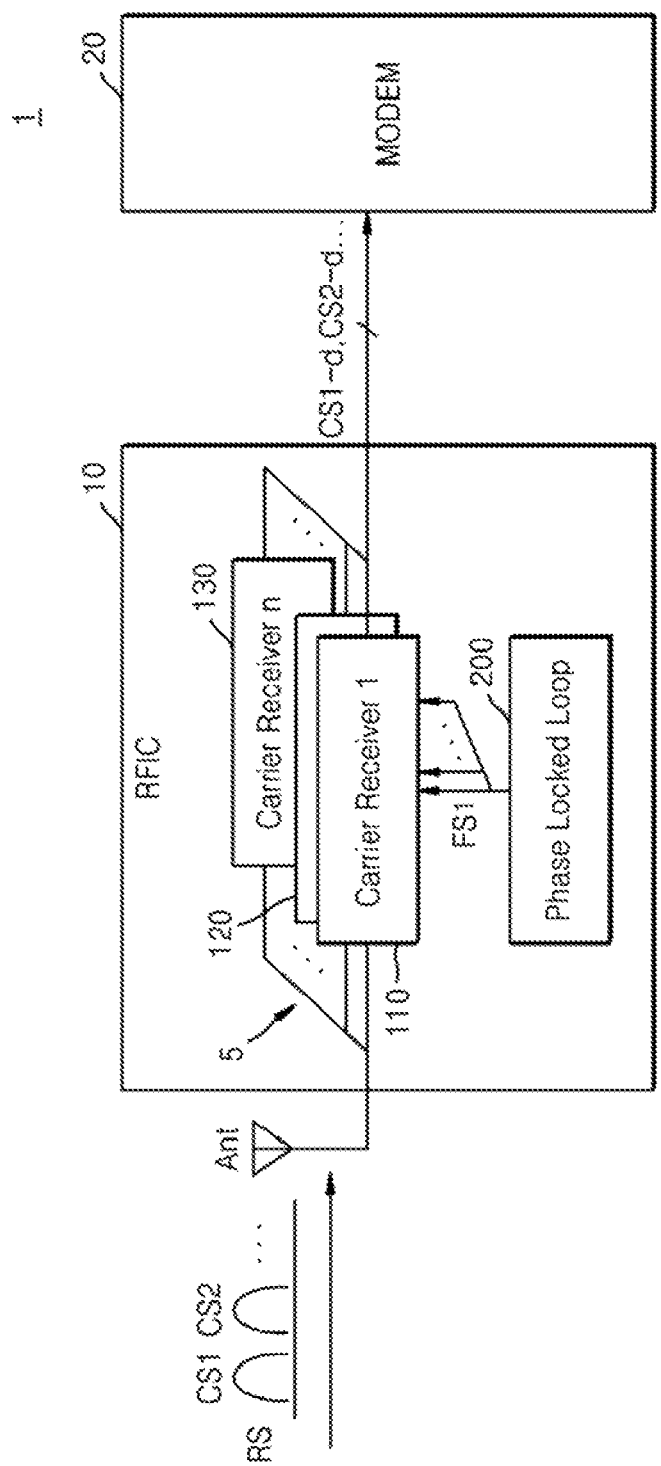
FIG. 1 is a block diagram of a wireless communication device according to an example embodiment.

FIG. 1 is a block diagram of a wireless communication device, 1, according to an example embodiment. Wireless communication device 1 may be any type of communication device for receiving and/or transmitting a carrier aggregated signal. Some examples of wireless communication device 1 include a base station (BS), an access point (AP), user equipment (UE) and a client device. A UE is mobile or fixed wireless communication equipment and may be referred to as terminal equipment, a mobile station (MS), a mobile terminal (MT), a user terminal (UT), a subscriber station (SS), a wireless device, or a handheld device. A BS may be a fixed station configured to communicate with UEs and/or another BS, A BS may be referred to as a Node B, an evolved Node B (eNB), or abase transceiver system (BTS). An AP may form a communication connection with one or more client devices based on a wireless fidelity (WiFi) communication protocol.

The wireless communication device 1 may receive a receiving signal RS (interchangeably, a "receive signal") from another wireless communication device of a wireless communication system using an antenna Ant. Examples of the wireless communication system include but are not limited to a long-term evolution (LTE) system, an LIE-advance (LTE-A) system, a code-division multiple access (CDMA) system, a global system for mobile communications (GSM) system, a wireless local area network (WLAN) system, a WiFi system, a Bluetooth system, a Bluetooth low-energy (BLE) system, a ZigBee system, a near-field communication (NFC) system, a magnetic secure transmission system, a radio-frequency (RF) system, and a body area network (BAN) system.

A plurality of wireless communication devices included in the wireless communication system may be connected to each other using a wireless communication network. Wireless communication networks may share available network resources and support the communication of a plurality of users. For example, in the wireless communication networks information may be transmitted using various modulation and spectrum allocation methods, such as code division multiple access (CDMA), frequency division multiple access (FDMA), time division multiple access (TDMA), orthogonal frequency division multiple access (OFDMA), and single-carrier frequency division multiple access (SC-FDMA).

Herein, a "carrier signal" is a modulated carrier, which is a band-limited signal containing spectral energy over a band encompassing the carrier frequency. Carrier aggregation is a technique by which a plurality of carrier signals are merged within a wireless communication signal to thereby them a "carrier aggregated signal". Each carrier signal may occupy a respective bandwidth within a wider frequency range of the carrier aggregated signal. Since each carrier signal carries information, the use of carrier aggregation may allow for an increase in the data transmission rate and/or other performance benefits as compared to a single carrier system.

As shown in FIG. 1, the wireless communication device 1 includes an RFIC 10 and a MODEM 20, where RFIC 10 may include a plurality of carrier receivers (e.g., 110, 120, and 130) and a phase-locked loop (PLL) 200. While only receiver circuitry is shown in FIG. 1, RFIC 10 may further include transmitter circuitry or generating a carrier aggregated transmit signal, described later. In other embodiments, device 1 may use conventional transmitter circuitry, or is just a receiving device and omits transmitter circuitry. On receive, RFIC 10 receives the carrier aggregated receive signal RS, which includes n carrier signals CS1 to CSn, where n is two or more and may be dependent on the particular application or protocol. The PLL 200 may output a "first frequency" signal FS1 to each of the carrier receivers 110, 120, and 130, where the first frequency signal FS1 is a signal with a sinusoidal, square wave or other shaped waveform oscillating at a first, fixed frequency. The PLL 200 may be a feedback circuit configured to maintain a frequency of an output signal constant. The PLL 200 may fix an adjustment point so as to avoid phase jitter and output a stable first frequency signal FS1 to each of the carrier receivers 110, 120, and 130.

Each of the carrier receivers 110, 120, and 130 may receive a portion of the receive signal RS from the antenna Ant through a signal divider 5 which divides the receive signal RS from the antenna into a plurality of signal portions, each being an attenuated version of the receive signal RS. (Hereafter, for convenience of description, each of these portions of the receive signal RS received by a respective carrier receiver may be referred to as just ale receive signal RS.) Each of the carrier receivers 110, 120 and 130 may frequency translate (e.g. down convert) the receive signal RS. In other embodiments, a plurality of antennas are provided and the signal divider 5 is omitted, where each antenna receives the receive signal RS and provides the same to a respective carrier receiver 110, 120 or 130. Each of the carrier receivers 110, 120 and 130 may frequency translate the receive signal RS by a different respective frequency offset (amount). Following frequency translation, carrier signals CS1 to CSn from the receive signal RS may be sampled by using one or more clock signals generated based on the first frequency signal FS1. Each clock signal be a sinusoidal, square wave or other shaped waveform.

In an example, the first carrier receiver 110 may sample a first carrier signal CS1 within the receiving signal RS and generate a first digital carrier signal CS1-$d$ containing baseband information of the first carrier signal CS1. To this end, the first carrier receiver 110 may use a second, fixed frequency signal, generated based on the first frequency signal FS1, to frequency translate the receiving signal RS by a first offset prior to sampling and digitally mixing the same. In other words, the second frequency signal may serve as a local oscillator (LO) signal for the frequency translation in the analog domain. The carrier signal CS1 may also be sampled using the second frequency signal as a clock signal for sampling.

The second carrier receiver 120 may sample a second carrier signal CS2 from the receiving signal RS and generate a second digital carrier signal CS2-$d$ containing baseband information of the second carrier signal CS2. Here, the second carrier receiver may use a third frequency signal for frequency translation by a second offset that differs from the first offset. In other words, the third frequency signal may serve as a local oscillator (LO) signal for the frequency translation. The third frequency signal is also generated based on the first frequency signal FS1. The carrier signal CS2 may also be sampled using the third frequency signal as a clock signal for sampling.

According to the inventive concept, each of the carrier receivers 110, 120, and 130 may generate different respective fixed frequency signals based on the first frequency signal FS1 received from one PLL 200, and also sample carrier signals CS1 its CSn from the receiving signal RS using the generated fixed frequency signals. That is, the carrier receivers 110, 120, and 130 may share one PLL 200 with each other. Thus, the number of PLLs 200 may be reduced and an area and power consumption otherwise consumed for multiple PLLs 200 may be reduced.

Figure 2:
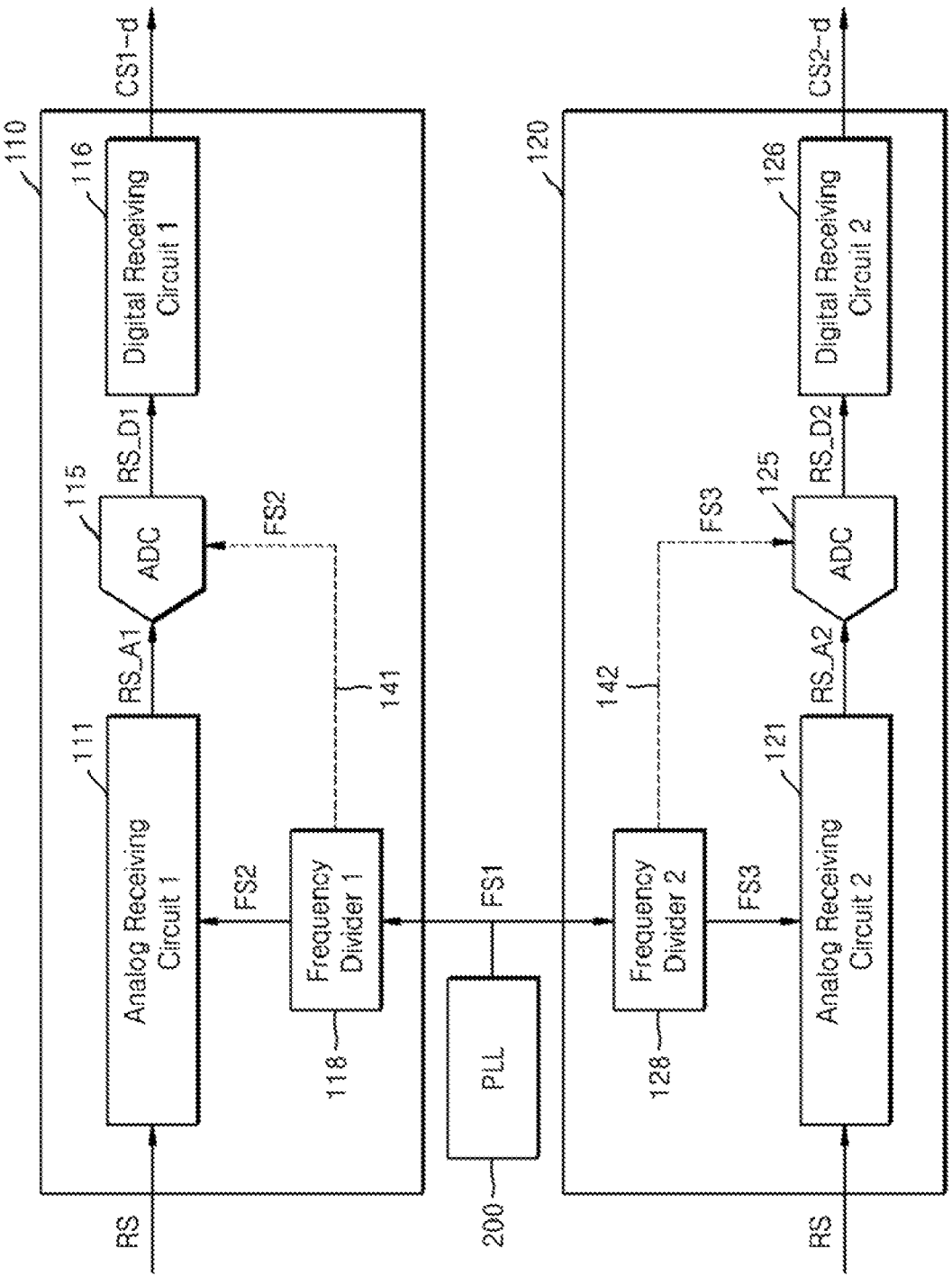
FIG. 2 is a block diagram of a radio-frequency integrated chip (RFIC) according, to an example embodiment.

FIG. 2 is a block diagram of an RFIC 10 according to an example embodiment. The RFIC 10 may include a first carrier receiver 110, a second carrier receiver 120, and an PLL 200. The first carrier receiver 110 may include a first analog receiving circuit 111, a first ADC 115, a first digital receiving circuit 116, and a first frequency divider 118. The second carrier receiver 120 may include a second analog receiving circuit 121, a second ADC 125, a second digital receiving circuit 126, and a second frequency divider 128. Operations of the second carrier receiver 120 may be the same as or similar to operations of the first carrier receiver 110 and thus redundant descriptions thereof will be omitted.

The PLL 200 may generate a first frequency signal FS1 having a first frequency and output the first frequency signal FS1 to the first frequency divider 118 and the second frequency divider 128. The first frequency divider 118 may divide, by a first divisor, the first frequency of the first frequency signal FS1 and thereby generate a second frequency signal FS2 having a second, fixed frequency. The second frequency divider 128 may divide, by a second divisor, the first frequency of the first frequency signal FS1 and thereby generate a third frequency signal FS3 having a third, fixed frequency. In an embodiment, the first divisor differs from the second divisor, such that the second and third frequencies are different. In addition, the second frequency may correspond to a first channel corresponding to a first carrier signal CS1, and the third frequency may correspond to a second channel corresponding to a second carrier signal CS2. For instance, the second, and third frequencies may be set so that the first and second carrier signals are down-converted, in the respective carrier receivers, to the same tower frequency band after respective analog mixing operations. In an example, at least one of the first and second divisors of the frequency dividers 118, 128 is an integer of two or more, in another example, at least one of the first and second divisors is a non-integer greater than one.

The first analog receiving circuit 111 may receive the receiving signal RS, process the receiving signal RS using the second frequency signal FS2, and thereby generate a first analog receiving signal RS_A1. Each of the receiving signal RS and the first analog receiving signal RS_A1 may be an analog signal having, a continuous magnitude. In addition, the processing of the receiving signal RS may include mixing, filtering, and amplifying the receiving signal RS in an analog domain as will be described below with reference to FIG. 3.

The first ADC 115 may receive a first analog receiving signal RS_A1 and generate, by sampling and quantizing signal RS_A1, a first digital receiving signal RS_D1. In an embodiment, ADC 115 may sample signal RS_A1 using signal FS2 as a clock signal provided along a path 141. In this case, signal FS2 is used both as an LO signal for down-conversion within the first analog receiving circuit 111, and as a clock signal for sampling. In other embodiments, ADC 115 may sample signal RS_A1 using signal FS1 as a clock signal, or by using another clock signal.

The first digital receiving circuit 116 may receive the first digital receiving signal RS_D1, process the first digital receiving signal RS_D1, and thereby generate the first digital carrier signal CS1-*d*. The first digital carrier signal CS1-*d* may be a sequence of bits representing information carried by the carrier signal CS1, such as a representation of a modulation envelope by which the carrier of carrier signal CS1 was modulated.

In a similar manner, the second carrier receiver 120 may process signal RS to derive the second digital carrier signal CS2-*d*. In this process, ADC 125 may sample a second analog receive signal RS_A2 using signal FS3 (provided via path 142) as a clock signal. This generates a second digital receive signal RS_D2 which is converted by digital receiving circuit 126 to the second digital carrier signal CS2-*d*.

According to the inventive concept, the first carrier receiver 110 and the second carrier receiver 120 may receive the first frequency signal FS1 from the common PLL 200 and process the first frequency signal FS1 in the analog domain using a frequency signal obtained by dividing the first frequency of the first frequency signal FS1 so that an area and power consumption otherwise allocated for multiple PLLs 200 may be reduced.

FIG. 2 illustrates an embodiment in which two carrier receivers 110 and 120 share one PLL 200. In other embodiments, three or more carrier receivers share one PLL 200 with each other.

Figure 3:
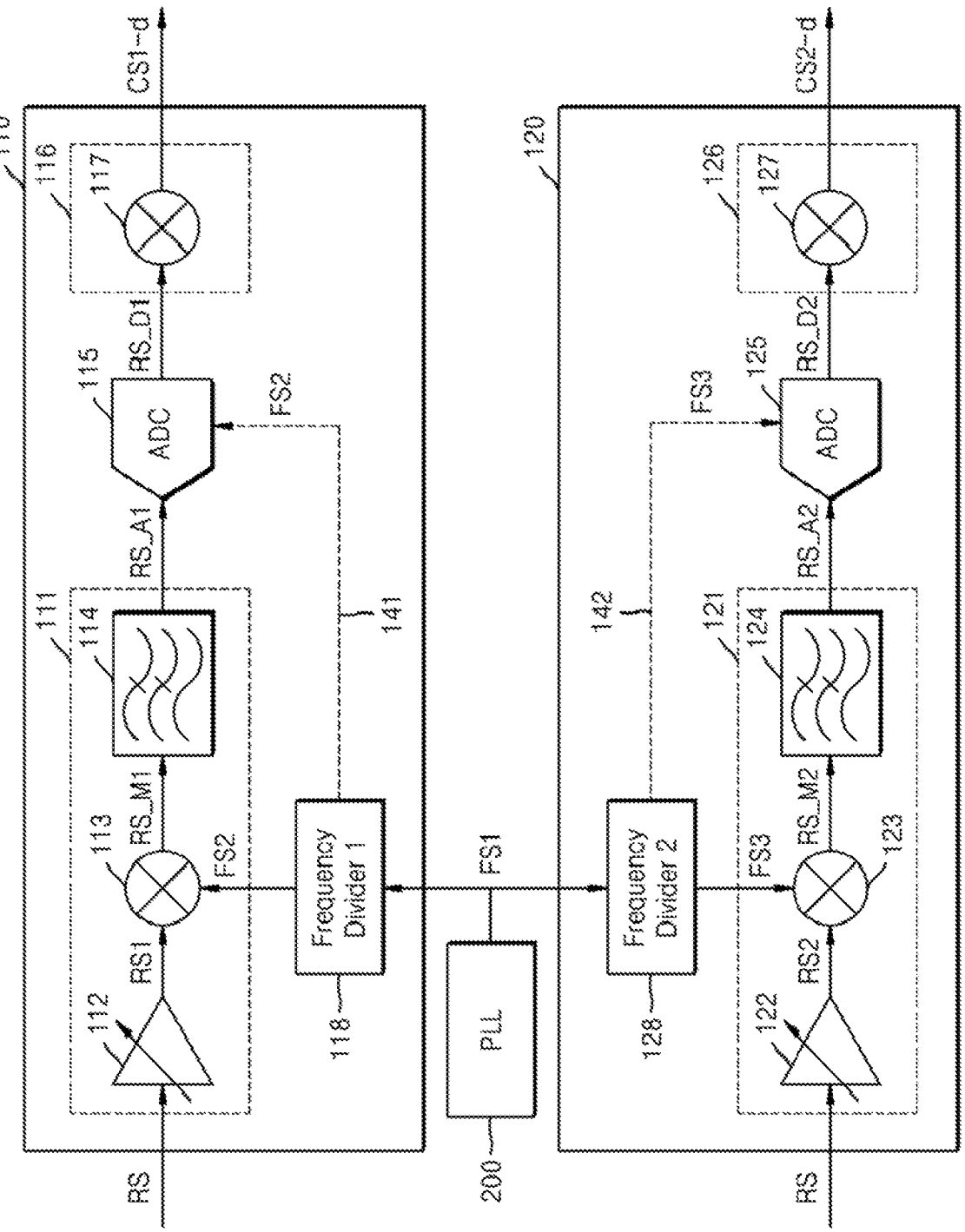
FIG. 3 is a block diagram of an RFIC according to an example embodiment.

FIG. 3 is a block diagram of the RFIC 10 of FIG. 2, further illustrating example configurations for the analog and digital receiving circuits according to an example embodiment. Redundant descriptions with respect to FIG. 2 will be omitted.

RFIC 10 of FIG. 3 may include first and second carrier receivers 110, 120 and PLL 200. The first carrier receiver 110 may include first analog receiving circuit 111, first ADC 115, first digital receiving circuit 116, and first frequency divider 118. The second carrier receiver 120 may include, second analog receiving circuit 121, second ADC 125, second digital receiving circuit 126, and, second frequency divider 128.

The first analog receiving circuit 111 may include a first receiving amplifier 112, a first analog, receiving mixer 113, and a first analog receiving filter 114, and the first digital receiving circuit 116 may include a first digital receiving mixer 117. The second analog receiving circuit 121 may include a second receiving amplifier 122, a second analog receiving mixer 123, and a second analog receiving filter 124, and the second digital receiving circuit 126 may include a second digital receiving mixer 127. Operations of the second carrier receiver 120 may be the same as or similar to operations of the first carrier receiver 110 and thus redundant description will be omitted.

The first receiving amplifier 112 may amplify receiving signal RS and generate a first amplified receiving signal RS1. In an example, the first receiving amplifier 112 may be a low-noise amplifier (LNA). The first analog receiving mixer 113 may receive the first amplified receiving signal RS1 and a second frequency signal FS2 translate a frequency band of the first amplified receiving signal RS1 based on the second frequency signal FS2, and generate a first "mixed" receiving signal RS_M1 (as noted above, a "mixed" signal herein refers to a signal that has been frequency translated by a mixer), (Herein, translating a frequency band of a signal refers to shilling all frequency components of the signal to thereby generate a frequency shifted signal substantially without distortion.) In an embodiment the second frequency signal FS2 may be a signal oscillating at a fixed second frequency, and the first analog receiving mixer 113 may down-convert the first amplified receiving signal RS1 based on the second frequency and thereby place the first amplified receiving signal RS1 in a predetermined channel. Signal RS_M1 may have frequency components lower than corresponding frequency components of signal RS, by an amount equaling, the frequency of signal FS2. (If signal RS is centered at X MHz and the frequency of FS2 is Y MHz, signal RS_M1 may be centered at Z=(X−Y) MHz.)

The first analog receiving filter 114 may filter the first mixed receiving signal RS_M1 and generate a first analog receiving signal RS_A1. Although FIG. 3 illustrates each of filters 114 and 124 as a low-pass filter (LPF), they may each alternatively be a band-pass filter (BPF) or a high-pass filter (HPF).

The first ADC 115 may generate first digital receiving signal RS_D1 by sampling and quantizing the first analog receiving signal RS_A1. The first digital receiving mixer 11, may computationally translate a frequency band of signal RS_D1 in a digital domain so as to generate first digital carrier signal CS1-*d*, and output the same to the MODEM (refer to 20 in FIG. 1). To this end, digital mixer 117 may perform digital signal processing on the digital samples comprising signal RS_D1. This generates first digital carrier signal CS1-*d* which may be composed of digital samples representing baseband signal energy of carrier signal CS1. These samples of baseband signal energy may then be demodulated by the MODEM, through calculations, to recover the original data carried by carrier signal CS1. Thus, according to the inventive concept, a frequency band of a receiving signal may be finely translated using a two-step mixing process using the first analog receiving mixer 113 and the first digital receiving mixer 117. Thus, the frequency translation by the first analog receiving mixer 113 may be a coarse frequency translation by a coarse frequency offset, and the frequency translation by the first digital receiving mixer 117 may be fine frequency translation by a fine frequency offset smaller than the coarse frequency offset. The second carrier receiver 120 may likewise use a two-step mixing process to generate the second digit carrier signal CS2-*d*.

Figure 4:
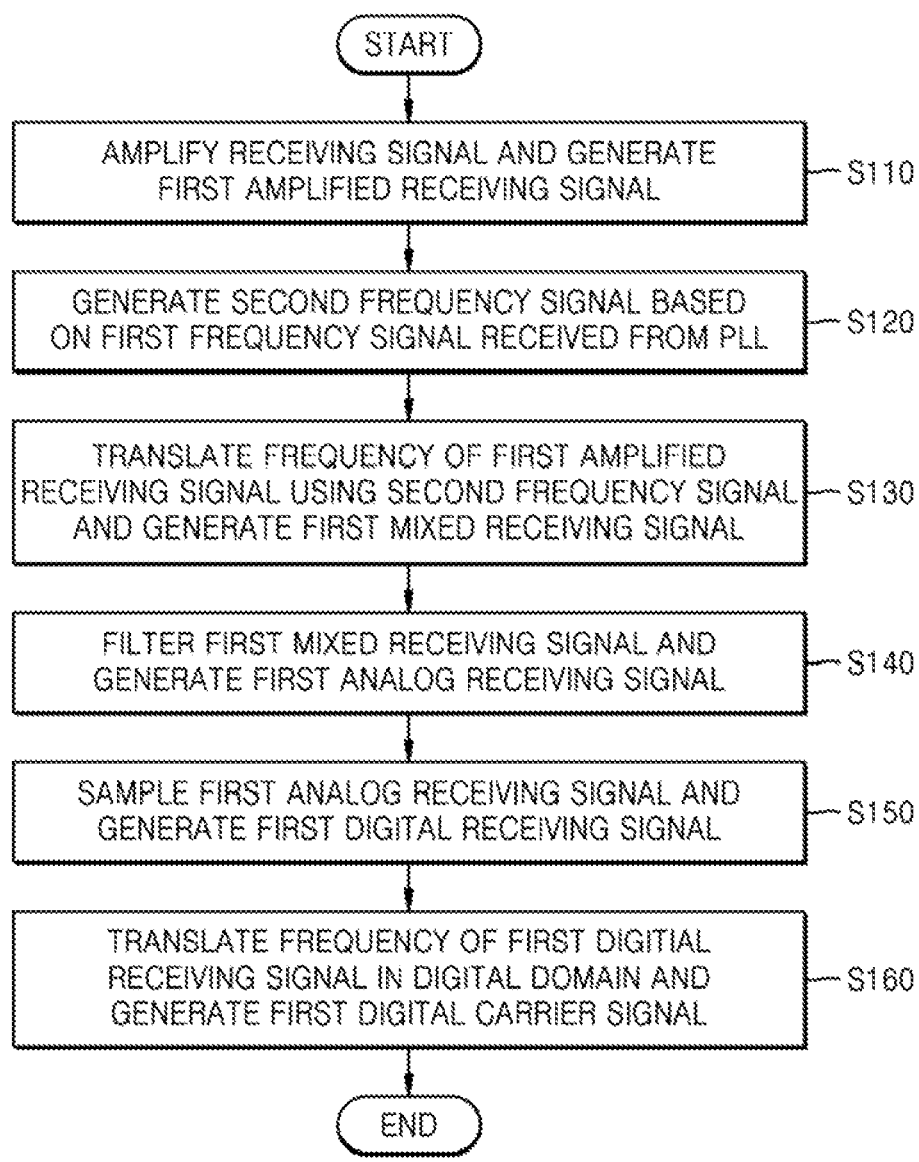
FIG. 4 is a flowchart of a method of operating a carrier receiver, according to an example embodiment.

FIG. 4 is a flowchart of a method of operating a carrier receiver 110, according to an example embodiment.

Referring to FIGS. 3 and 4, the carrier receiver 110 may amplify a receiving signal RS and generate a first amplified receiving signal RS1 (S110). The carrier receiver 110 may generate a second frequency signal FS2 based on a first frequency signal FS1 received from the PLL 200 (S120). The carrier receiver 110 may translate a frequency band of a first amplified receiving signal RS1 using a second frequency signal FS2 and generate a first mixed receiving signal RS_M1 (S130). The carrier receiver 110 may filter the first mixed receiving signal RS_M1 and generate the first analog receiving signal RS_A1 (S140). The carrier receiver 110 may sample RS_A1 and generate a first digital receiving signal RS_D1 (S150). The carrier receiver 110 may translate a frequency band of RS_D1 in a digital domain and generate a first digital carrier signal CS1-d (S160).

Figure 5A:
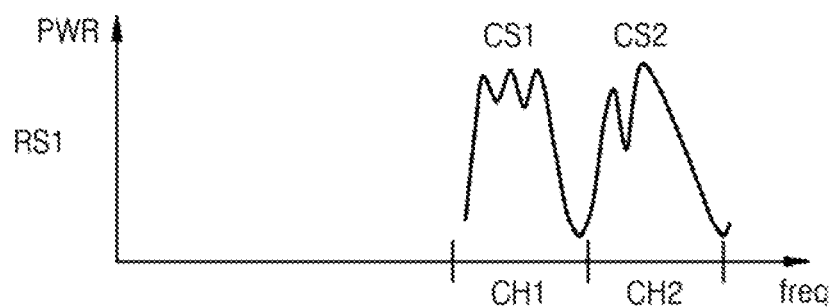
FIGS. 5A, 5B and 5C are graphs illustrating a method of operating an analog receiving circuit, according to example embodiments.
Figure 5B:
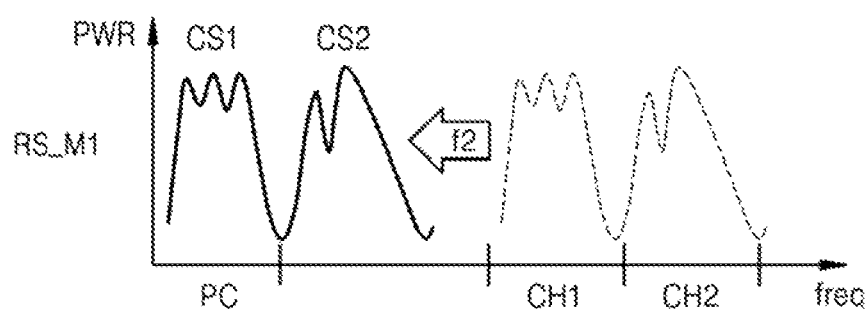
Figure 5C:
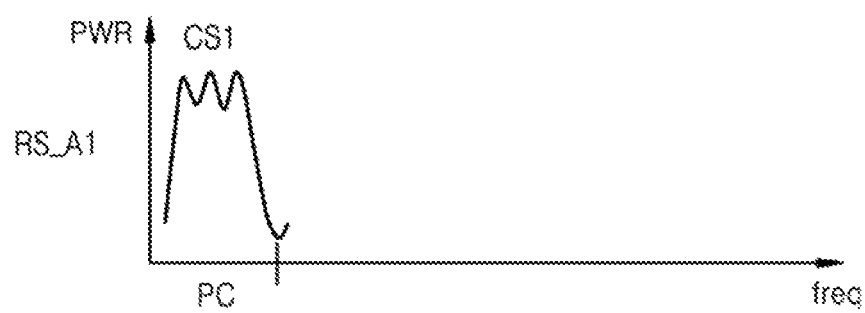

FIGS. 5A, 5B and 5C are graphs illustrating a method of operating an analog receiving circuit, according to example embodiments. In FIGS. 5A to 5C, the abscissa denotes a frequency freq, and the ordinate denotes power intensity PWR.

Referring to FIGS. 3 and 5A, within carrier receiver 110, the first receiving amplifier 111 may amplify the receiving signal RS and generate the first amplified receiving signal. RS1 including the first carrier signal CS1 and a second carrier signal CS2. The first carrier signal CS1 included in the first amplified receiving signal RS1 may be disposed in a first channel CH1, and the second carrier signal CS2 may be disposed in a second channel CH2.

Referring to FIGS. 3 and 5B, the first analog receiving mixer 113 may translate the frequency band of the first amplified receiving signal RS1 using the second frequency signal FS2 having a second frequency f2 and generate the first mixed receiving signal RS_M1. The first carrier signal CS1 included, in the first mixed receiving signal RS_M1 may be located in a predetermined channel PC, which may be a channel that is f2 Hz lower than the first channel CH1.

Referring to FIGS. 3 and 5C, the first analog receiving filter 114 may filter the first mixed receiving signal RS_M1 and generate the first analog receiving signal RS_A1. In an embodiment, the first analog receiving filter 114 may filter out signals outside the predetermined channel PC (eliminate signals other than those within the predetermined channel PC). In the embodiment shown in FIG. 5C, the first analog receiving filter 114 may eliminate the second carrier signal CS2 included in the first mixed receiving signal RS_M1 and generate the first analog receiving signal RS_A1 including only the first carrier receiving signal CS1.

In a similar manner, within carrier receiver 120, the second analog receiving circuit 121 may translate the frequency band of receive signal RS by a frequency offset equal to f3 Hz so as to place the second carrier signal CS2 within a predetermined channel. This predetermined channel may be the same or different as the channel PC, depending on the divisor of frequency divider 128, and signals outside the channel may be filtered out to facilitate the recovery of information carried by the second carrier signal CS2.

Figure 6:
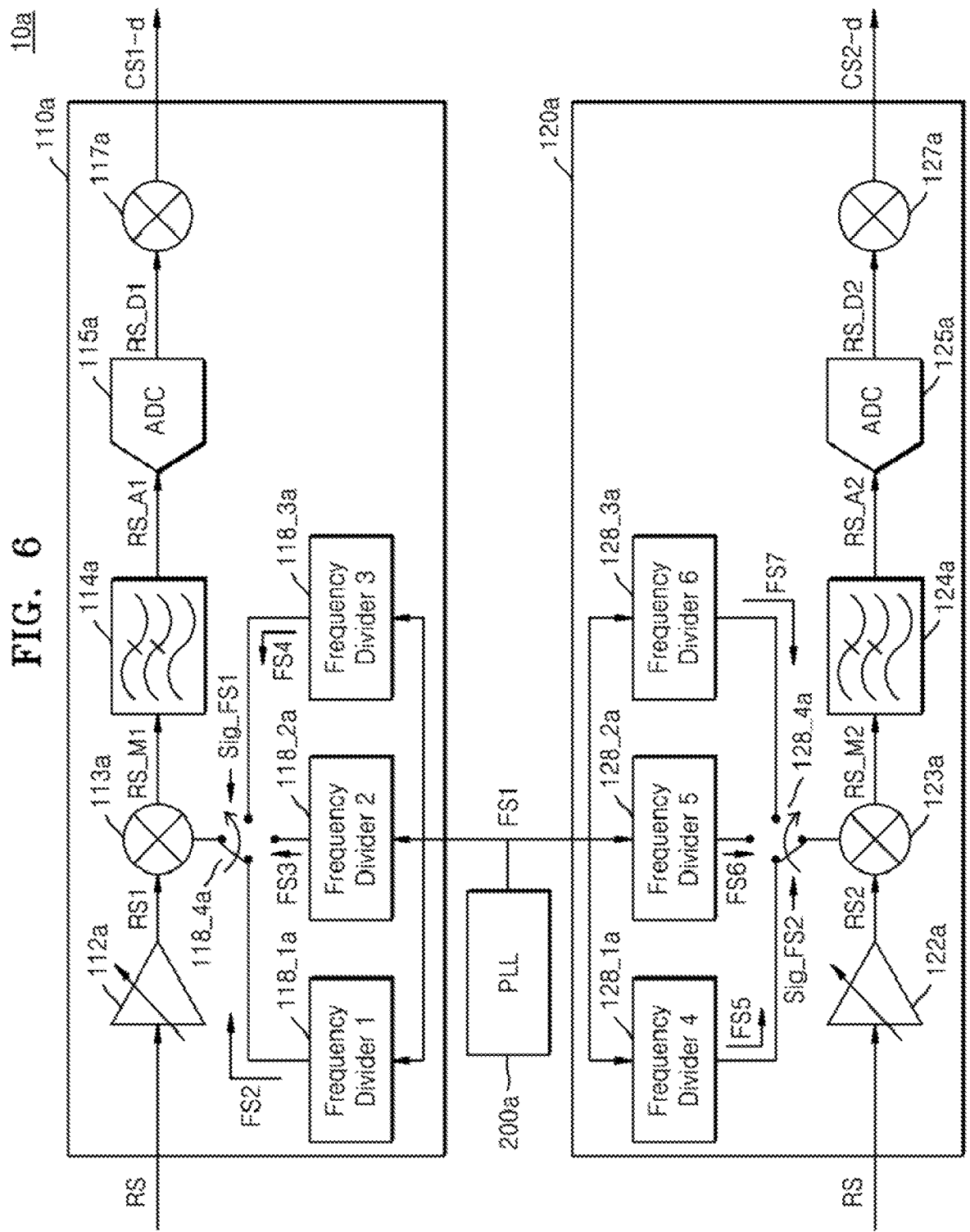
FIG. 6 is a block diagram of an RFIC according to an example embodiment.

FIG. 6 is a block diagram of an RFIC, 10a, according to an example embodiment. In this example, an amount of analog frequency translation within each carrier receiver may be dynamically selectable. Redundant descriptions with respect to FIG. 3 will be omitted.

Referring to FIG. 6, the RFIC 10a may include a first carrier receiver 110a, a second carrier receiver 120a, and a PLL 200a. The first carrier receiver 110a may include a first receiving amplifier 112a, a first analog receiving mixer 113a, a first analog receiving filter 114a, a first ADC 115a, a first digital receiving mixer 117a, a first frequency divider 118_1a, a second frequency divider 118_2a, a third frequency divider 118_3a, and a first frequency switch 118_4a. The second carrier receiver 120a may include a second receiving amplifier 122a, a second analog receiving mixer 123a, a second analog receiving filter 124a, a second ADC 125a, a second digital receiving mixer 127a, a fourth frequency divider 128_1a, a fifth frequency divider 128_2a, a sixth frequency divider 128_3a, and a second frequency switch 128_4a. Operations of the second carrier receiver 120a may be the same as or similar to operations of the first carrier receiver 110a and thus, redundant descriptions thereof will be omitted.

The first frequency divider 118_1a may generate a second frequency signal FS2 having a second frequency based on a received first frequency signal FS1. The second frequency divider 118_2a may, generate a third frequency signal FS3 having a third frequency based on the received first frequency signal FS1. The third frequency divider 118_3a may generate a fourth frequency signal FS4 having a fourth frequency based on the received first frequency signal FS1. The first frequency switch 118_4a may output one of the second frequency signal FS2, the third frequency signal FS3, and the fourth frequency signal FS4 to the first analog receiving mixer 113a based on a first frequency selection signal Sig_FS1. In an example, the second frequency may be higher than the third frequency, and the third frequency may be higher than the fourth frequency.

According to an embodiment, the first carrier receiver 110a may selectively translate a frequency band of a first amplified receiving signal RS1 based on the first frequency selection signal Sig_FS1. As a result, the first carrier receiver 110a may selectively sample a target carrier signal from a receiving signal RS based on the first frequency selection signal Sig_FS1.

FIG. 6 illustrates an example in which a plurality of frequency signals (e.g., FS2, FS3, and FS4) output by a plurality of frequency dividers (e.g., 118_1a, 118_2a, and 118_3a) included in the first carrier receiver 110a are different from a plurality of frequency signals (e.g., FS5, FS6, and FS7) output by a plurality of frequency dividers 1281a, 128_2a, and 128_3a included in the second carrier receiver 120a. In an alternative example, the corresponding frequency signals of the frequency signals FS2, FS3, and FS4 output by the frequency dividers 118_1a, 118_2a, and 183a and the frequency signals FS5, FS6, and FS7 output by the frequency dividers 128_1a, 128_3a and 128_3a may have the same frequency. In this case, the amount of frequency translation in each carrier receiver 110a, 120a may still differ from one another, through selection of a different respective frequency divider.

In alternative examples, the number of frequency dividers in each carrier receiver 110a, 110b may be more or fewer than three. In a further alternative embodiment, the switches 118_4a and 128_4a may be eliminated if a frequency divider in each carrier receiver is configured to selectively output one of a plurality of frequency signals based on the first frequency signal FS1 and a control signal (not shown).

Figure 7:
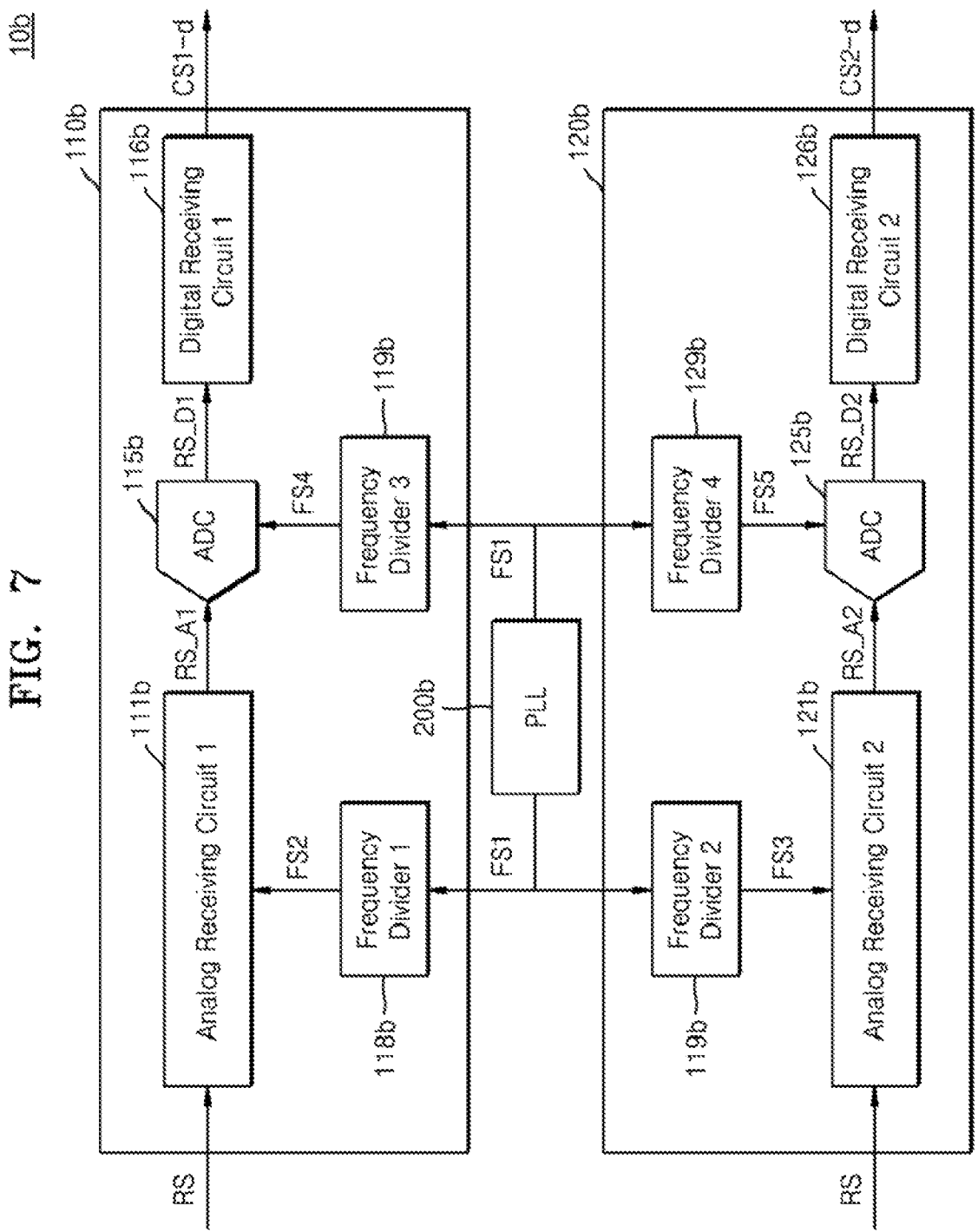
FIG. 7 is a block diagram of an RFIC according to an example embodiment.

FIG. 7 is a block diagram of an RFIC, 10b, according to an example embodiment. Redundant descriptions with respect to FIG. 2 will be omitted.

Referring to FIG. 7, the RFIC 10b may include a first carrier receiver 110b, a second carrier receiver 120b, and a PLL 200b. File first carrier receiver 110b may also include a first analog receiving circuit 111b, a first ADC 115b, a first digital receiving circuit 116b, a first frequency divider 118b, and a third frequency divider 119b. The second carrier receiver 120b may include a second analog receiving circuit 121b, a second ADC 125b, a second digital receiving circuit 126b, a second frequency divider 128b, and, a fourth frequency divider 129b. Operations of the second carrier receiver 120b may be the same as or similar to operations of the first carrier receiver 110b and thus, redundant descriptions thereof will be omitted.

The third frequency divider 119b may receive a first frequency signal FS1 from the PLL 200b and generate a fourth frequency signal FS4 having a fourth fixed frequency. The first ADC 115b may sample a first analog receiving signal RS_AL1 using the fourth frequency signal FS4 as a clock signal, and generate a first digital receiving signal RS_D1. In an embodiment, the fourth frequency signal FS4 may have the same frequency as a fifth frequency signal FS5 of the second carrier receiver 120b. In another embodiment, signal FS4 has a different frequency from that of signal FS5. In still another embodiment, at least one of the first ADC 115b and the second ADC 125b directly receives the first frequency signal FS1 from the PLL 200b and perform an ADC operation using the first frequency signal FS1 as a clock signal, rather than using signal FS4 or FS5 as the clock signal. In yet another alternative embodiment, only one, but not both, of the first and second ADCs 115b, 125b shares the PLL 200b with the respective analog receiving circuit 111b or 121b.

Figure 8:
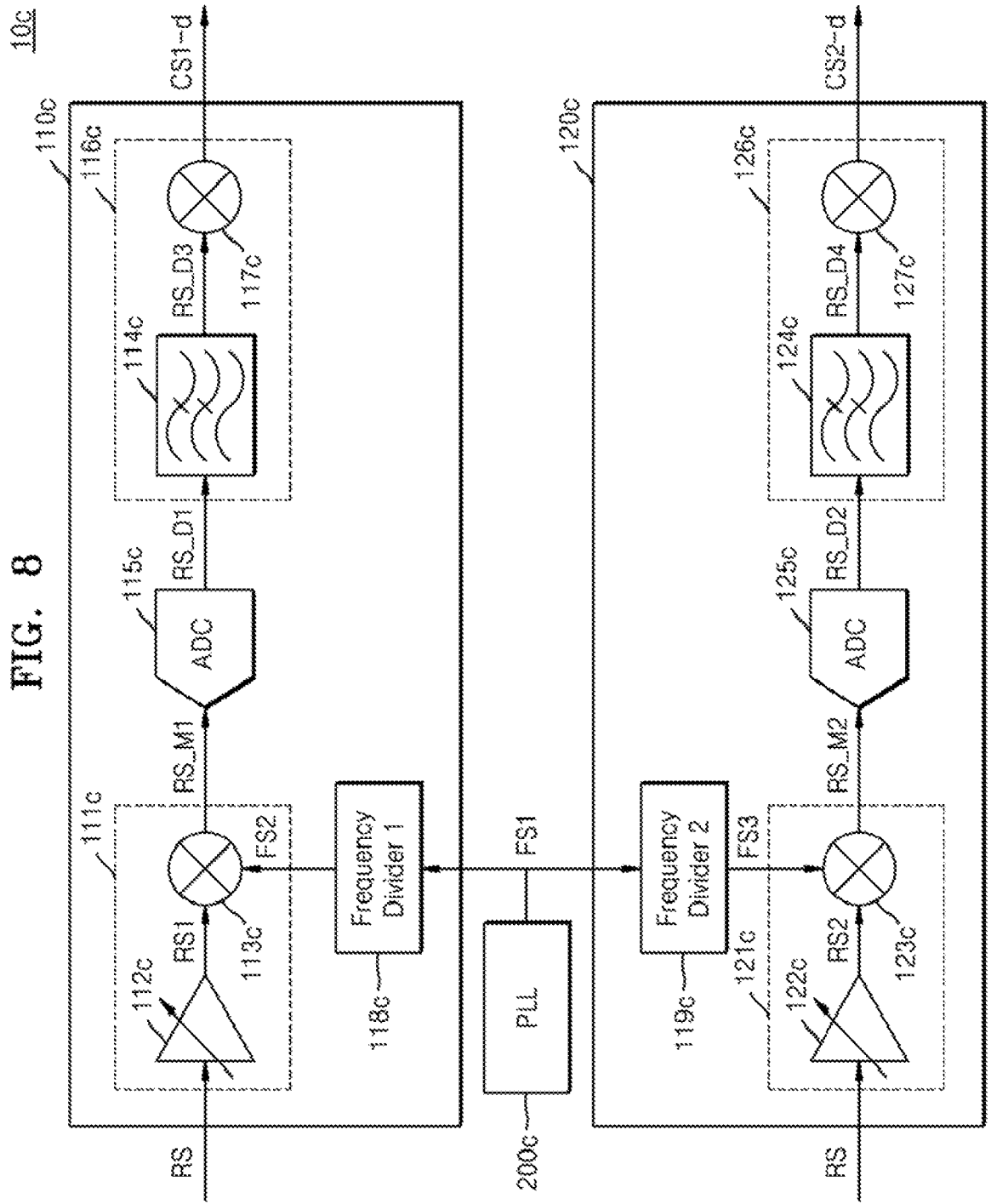
FIG. 8 is a block diagram of an RFIC according to an example embodiment.

FIG. 8 is a block diagram of an RFIC, 10c, according to an example embodiment. In this embodiment, filtering of a frequency translated signal may be performed in the digital domain rather than in the analog domain. Redundant descriptions with respect to the RFIC of FIG. 3 will be omitted.

Referring to FIG. 8, the RFIC 10c may include a first carrier receiver 110c, a second carrier receiver 120c, and a PLL 200c. The first carrier receiver 110c may include a first analog receiving circuit 111c, a first ADC 115c, a first digital receiving circuit 116c, and a first frequency divider 118c. The second carrier receiver 120c may include a second analog receiving circuit 121c, a second ADC 125c, a second digital receiving circuit 126c, and a second frequency divider 128c.

The first analog receiving circuit 111c may include a first receiving amplifier 112c and a first analog receiving mixer 113c. The first digital receiving circuit 116c may include a first digital receiving filter 114c and a first digital receiving mixer 117c. The second analog receiving circuit 121c may include a second receiving amplifier 122c and a second analog receiving mixer 123c. The second digital receiving circuit 126c may include a second digital receiving filter 124c and a second digital receiving mixer 127c. Operations of the second carrier receiver 120c may be the same as or similar to operations of the first carrier receiver 110c and thus, redundant descriptions thereof will be omitted.

The first analog receiving mixer 113c may translate a frequency band of a first amplified receiving signal RS1 based on a second frequency signal FS2 and thereby generate a first mixed receiving signal RS_M1. The first ADC 115c may sample the first mixed receiving signal RS_M1 and generate a first digital receiving signal RS_D1. The first digital receiving filter 114c may filter the first digital receiving signal RS_D1 in the digital domain and thereby generate a third digital receiving signal RS_D3. The first digital receiving mixer 117c may translate the frequency band of the first digital receiving signal RS_D3 in the digital domain and thereby generate a first digital carrier signal CS1-d.

Figure 9:
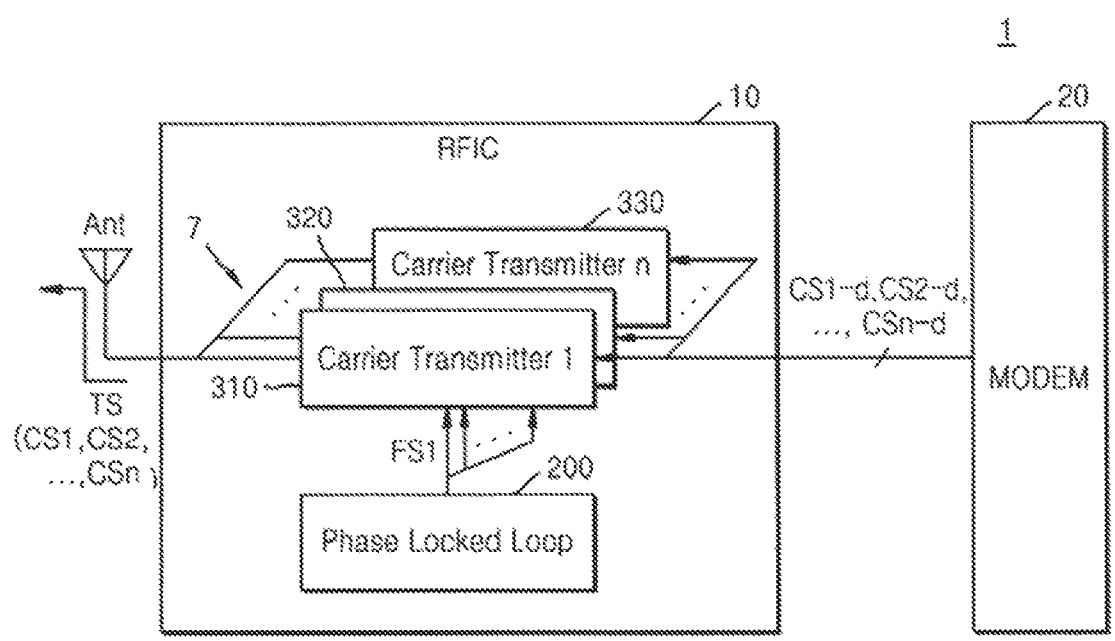
FIG. 9 is a block diagram of a wireless communication device according to an example embodiment.

FIG. 9 is a block diagram of an example transmitter portion of wireless communication device 1, according to an embodiment. Redundant description of identical elements shown in FIG. 1 will be omitted. As mentioned above in the discussion of FIG. 1, the RFIC 10 may include carrier receivers and/or carrier transmitters; the RFIC 10 of FIG. 10 includes at least the carrier transmitters. Wireless communication device may include RFIC 10 and MODEM 20, where RFIC 10 may include a plurality n of carrier transmitters (e.g., first, second, and third carrier transmitters 310, 320, and 330) and, a PLL 200. As noted above, a carrier transmitter refers to transmitter circuitry configured to process and transmit at least one carrier signal of a carrier aggregated signal. The PLL 200 may output a first frequency signal FS1 to each of the first, second, and third carrier transmitters 310, 320, and 330.

Each of the first, second, and third carrier transmitters 310, 320, and 330 may receive a plurality of digital carrier signals CS1-d to CSn-d from the MODEM 20, and process (e.g., filter, mix and upconvert and/or amplify) the plurality of carrier signals CS1-d to CSn-d using a respective fixed frequency signal generated based on a first frequency signal PSI. A carrier aggregated transmitting signal TS may be generated by combining the processed signals using a combiner 7. Each digital carrier signal CS1-d to CSn-d may be a stream of digital samples of a modulated information signal. In an example, the first carrier transmitter 310 may process the first digital carrier signal CS1-d using a second frequency signal generated based on the first frequency signal FS1, and the second carrier transmitter 320 may process the second digital carrier signal CS2-d using a third frequency signal generated based on the first frequency signal FS1, to thereby generate first and second analog carrier signals CS1, CS2. The first carrier signal CS1 may be merged with the second carrier signal CS2 using the combiner 7 to generate at least part of the transmitting signal TS, which may be transmitted through an antenna Ant.

According to the inventive concept, the first, second, and third carrier transmitters 310, 320, and 330 may generate respective target frequency signals based on the first frequency signal FS1 received from a single PLL 200, and process the plurality of carrier signals CS1 to CSn (e.g., after they were converted to analog form) using the generated frequency signals. That is, the first, second, and third carrier transmitters 310, 320, and 330 may share one PLL 200. Thus, the number of PLLs 200 otherwise provided may be reduced and an area and power consumption for such PLLs 200 may be reduced.

Figure 10:
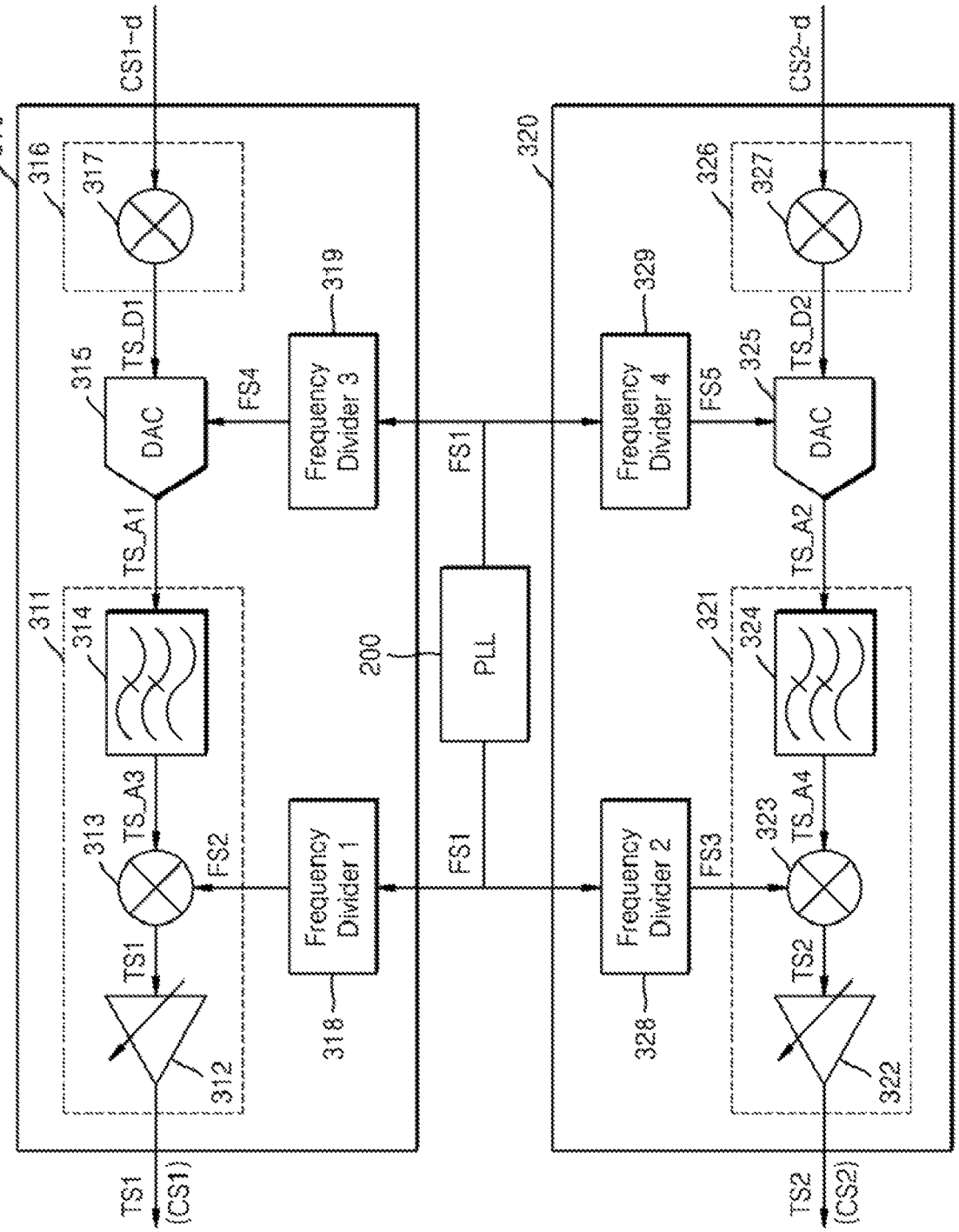
FIG. 10 is a block diagram of an RFIC according to an example embodiment.

FIG. 10 is a block diagram of an RFIC 10 according to an example embodiment. Redundant descriptions as with reference to FIGS. 3 and 9 will be omitted.

Referring to FIG. 10, the RFIC 10 may include the first carrier transmitter 310, second carrier transmitter 320, and PLL 200. The first carrier transmitter 310 may further include a first analog transmitting circuit 311, a first DAC 315, a first digital transmitting circuit 316, a first frequency divider 318, and a third frequency divider 319. The second carrier transmitter 320 may include a second analog transmitting circuit 321, a second DAC 325, a second digital transmitting circuit 326, a second frequency divider 328, and a fourth frequency divider 329.

The first analog transmitting circuit 311 may include a first transmitting amplifier 312, a first analog, transmitting mixer 313, and a first analog transmitting filter 314. The first digital transmitting circuit 316 may include a first digital transmitting mixer 317. The second, analog transmitting circuit 321 may include a second transmitting, amplifier 322, a second analog transmitting mixer 323, and a second analog transmitting filter 324. The second digital transmitting circuit 326 may include a second digital transmitting mixer 327. Operations of the second carrier transmitter 320 may be the same as or similar to operations of the first carrier transmitter 310, and thus, redundant descriptions thereof will be omitted.

The first digital transmitting mixer 317 may translate (e.g., up-convert) a frequency band of first carrier signal CS1-d in a digital domain and thereby generate a first digital transmitting signal TS_D1. Also, at third frequency divider 319 may generate a fourth frequency signal FS4 based on the first frequency signal FS1. The first DAC 315 may receive the fourth frequency signal FS4 and generate a first analog transmitting signal from the first digital transmitting signal TS_D1 using the fourth frequency signal FS4 as a clock for D/A conversion. The first analog transmitting filter 314 may filter the first analog transmitting signal TS_A1 and generate a third analog transmitting signal TS_A3. The first frequency divider 318 may generate a second frequency signal FS2 based on the first frequency signal FS1. The first analog transmitting mixer 313 may translate (e.g. up-convert) a frequency band of the third analog transmitting signal TS_A3 using the second frequency signal FS2 and thereby generate a first transmitting signal TS1. The first transmitting amplifier 312 may amplify the first transmitting signal TS1 and output the amplified first transmitting signal TS1, which contains mainly the frequencies of a carrier signal CS1 carrying the information of digital carrier signal CS1-$d$. In an example, the first transmitting amplifier 312 may be a power amplifier (PA).

As noted above, the RFIC 10 may further include the combiner (merging circuit) 7, which may be configured to merge the first transmitting signal TS1 with a second transmitting signal TS2, the latter containing mainly the frequencies of a carrier signal CS2 in a band different from that of signal CS1. The merging circuit 7 may merge the first transmitting signal TS1 received from the first carrier transmitter 310 with the second transmitting signal TS2 received from the second carrier transmitter 320, generate a carrier aggregated transmitting signal TS, and output the generated transmitting signal TS through an antenna to the exterior.

FIG. 10 illustrates an embodiment in which fixed frequency signals generated based on the first frequency signal FS1 are output to the first and second analog transmitting mixers 313 and 323 and the first and second DACs 315 and 325 included in each of the first and second carrier transmitters 310 and 320. However, the inventive concept is not limited thereto, and may be applied to an embodiment in which a frequency signal generated based on the first frequency signal FS1 is output only to the first and second analog transmitting mixers 313 and 323 in a similar way to FIG. 3. In this case, clock signals used for the D/A, conversion by DACs 315 and 325 may be obtained elsewhere.

In addition, FIG. 10 illustrates an embodiment in which frequency signals FS2 and FS3 generated by the first and second frequency dividers 318 and 328 are respectively output to the first and second analog transmitting mixers 313 and 323. However, the inventive concept is not limited thereto, and may be applied to an embodiment in which any one of a plurality of frequency signals generated by a plurality of frequency dividers is selectively output tat any given time) to the first and second analog transmitting mixers 313 and 323 in a similar way to the receive path embodiment of FIG. 6.

Moreover, FIG. 10 illustrates an embodiment in which the first and second analog transmitting circuits 311 and 321 include the first and second transmitting amplifiers 312 and 322, the first and second analog transmitting mixers 313 and 323, and the first and second analog transmitting filters 314 and 324, respectively. However the inventive concept is not limited thereto, and may be applied to an embodiment in which the first and second analog transmitting circuits 311 and 321 include the first and second transmitting amplifiers 313 and 322 and the first and second analog transmitting mixers 313 and 323, respectively while each of the first and second digital transmitting circuits 316 and 326 include a digital transmitting filter and a digital transmitting mixer in a similar way to the receive path embodiment of FIG. 8.

Figure 11:
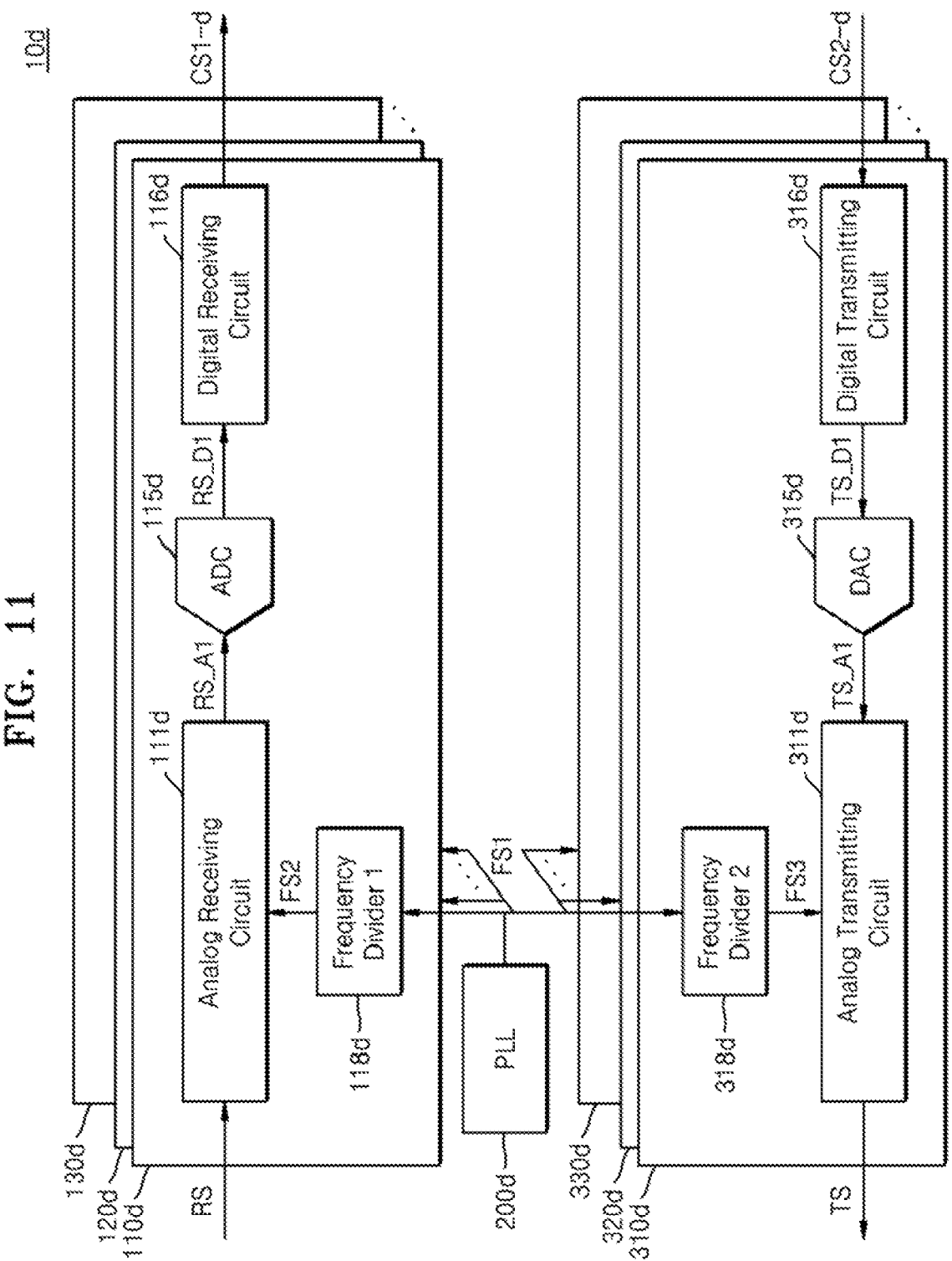
FIG. 11 is a block diagram of an RFIC according to an example embodiment.

FIG. 11 is a block diagram of an RFIC, 10$d$, according to an example embodiment. Redundant descriptions with respect to FIGS. 2 and 10 will be omitted. The RFIC 10$d$ may include a plurality of carrier receivers (e.g., 110$d$, 120$d$, and 130$d$) and a plurality of carrier transmitters (e.g., 310$d$, 320$d$, and 330$d$), and a PLL 200$d$. Also, each of the carrier receivers 110$d$, 120$d$, and 130$d$ may include an analog receiving circuit 111$d$, an ADC 115$d$, a digital receiving circuit 116$d$, and a first frequency divider 118$d$. Each of the carrier transmitters 310$d$, 320$d$, and 330$d$ may include an analog transmitting circuit 311$d$, a DAC 315$d$, a digital transmitting circuit 316$d$ and a second frequency divider 318$d$.

The PLL 200$d$ may output a first frequency signal FS1 to each of the carrier receivers 110$d$, 120$d$, and 130$d$ and the carrier transmitters 310$d$, 320$d$, and 330$d$. The first frequency divider 118$d$ may generate a second frequency signal FS2 based on the first frequency signal FS1 and output the second frequency signal FS2 to the analog receiving circuit 111$d$. The second frequency divider 318$d$ may generate a third frequency signal FS3 based on the first frequency signal FS1 and output the third frequency signal FS3 to the analog transmitting circuit 311$d$.

FIG. 11 illustrates an embodiment in which all the carrier receivers 110$d$, 120$d$, and 130$d$ and all the carrier transmitters 310$d$, 320$d$, and 330$d$ operate based on the first frequency signal FS1. In alternative embodiments, some, but not all, of the carrier receivers 110$d$, 120$d$, and 130$d$ and some, but not all, of the carrier transmitters 310$d$, 320$d$, and 330$d$ operate based on the first frequency signal FS1.

Figure 12:
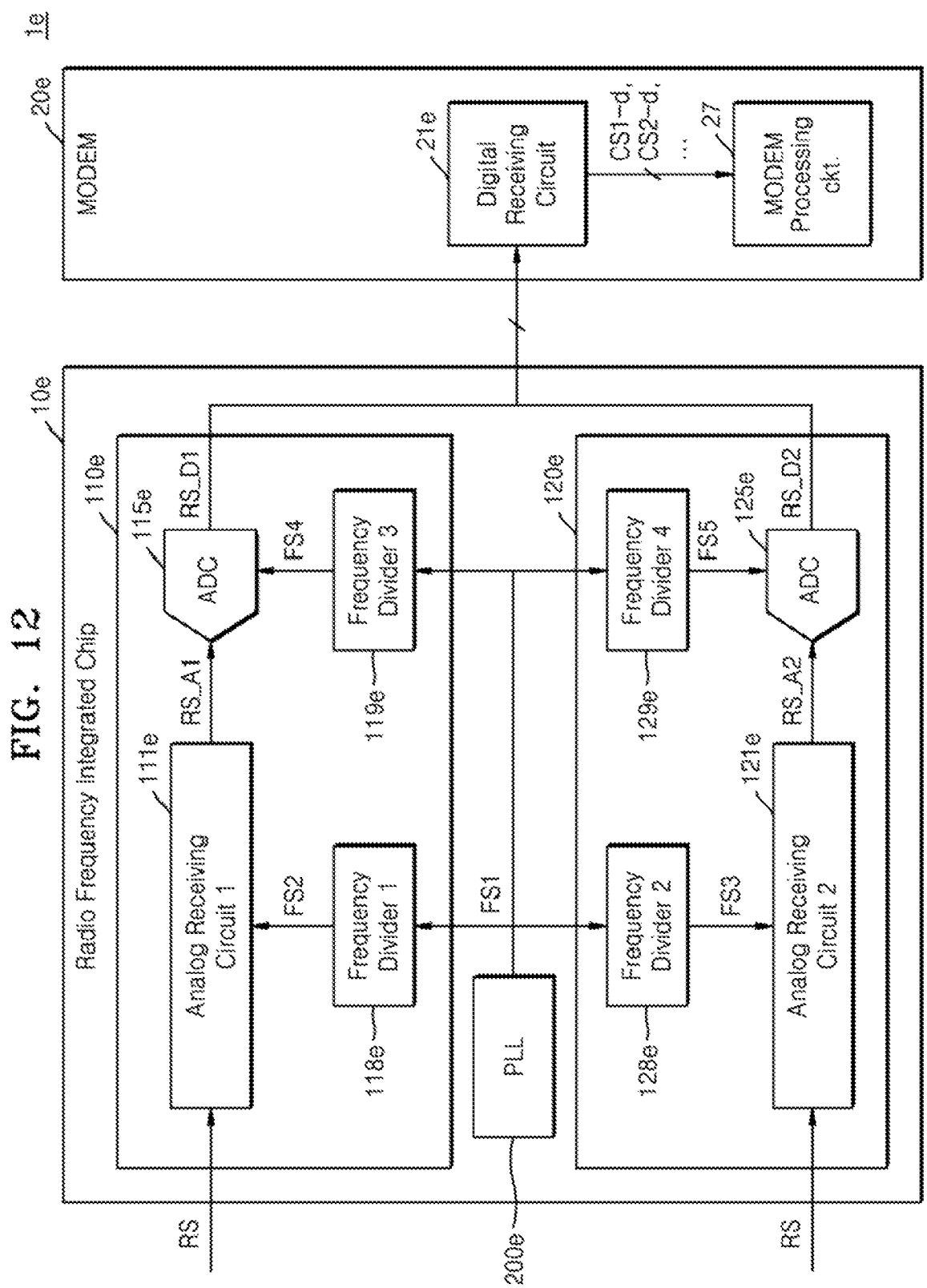
FIG. 12 is a block diagram of a wireless communication device according to an example embodiment.

FIG. 12 is a block diagram of a wireless communication device 1$e$ according to an example embodiment. The same descriptions as with reference to FIG. 2 will be omitted.

Referring to FIG. 12, the wireless communication device 1$e$ may include an RFIC 10$e$ and a MODEM 20$e$. The RFIC 10$e$ may further include a first carrier receiver 110$e$, a second carrier receiver 120$e$, and a PLL 200$e$, and the MODEM 20$e$ may include a digital receiving circuit 21$e$. The first carrier receiver 110$e$ may include a first analog receiving circuit 111$e$, a first ADC 115$e$, a first frequency divider 118$e$, and a third frequency divider 119$e$. The second carrier receiver 120$e$ may include a second analog receiving circuit 121$e$, a second ADC 125$e$, a second frequency divider 128$e$, and a fourth frequency divider 129$e$.

Unlike the embodiment shown in FIG. 2, the digital receiving circuit 21$e$ may be located in the MODEM 20$e$. The digital receiving circuit 21$e$ may process (e.g., mix or filter) a first digital receive signal RS_D1 received from the first ADC 115$e$ and a second digital receive signal RS_D2 received from the second ADC 125$e$ in a domain an thereby generate digital carrier signals CS1-$d$ and CS2-$d$. These digital carrier signals may then be output to a modem processing circuit 27 for demodulation. Alternatively, sampling by ADCs 115$e$, 125$e$ is sufficient to provide the digital receive signals RS_D1 and RS_D2 in a form suitable for direct demodulation, and these signals are routed directly to demodulation processing circuit 27. Note that the digital receive signals RS_D1 and RS_D2 may be provided on individual signal paths to MODEM 20$f$.

Figure 13:
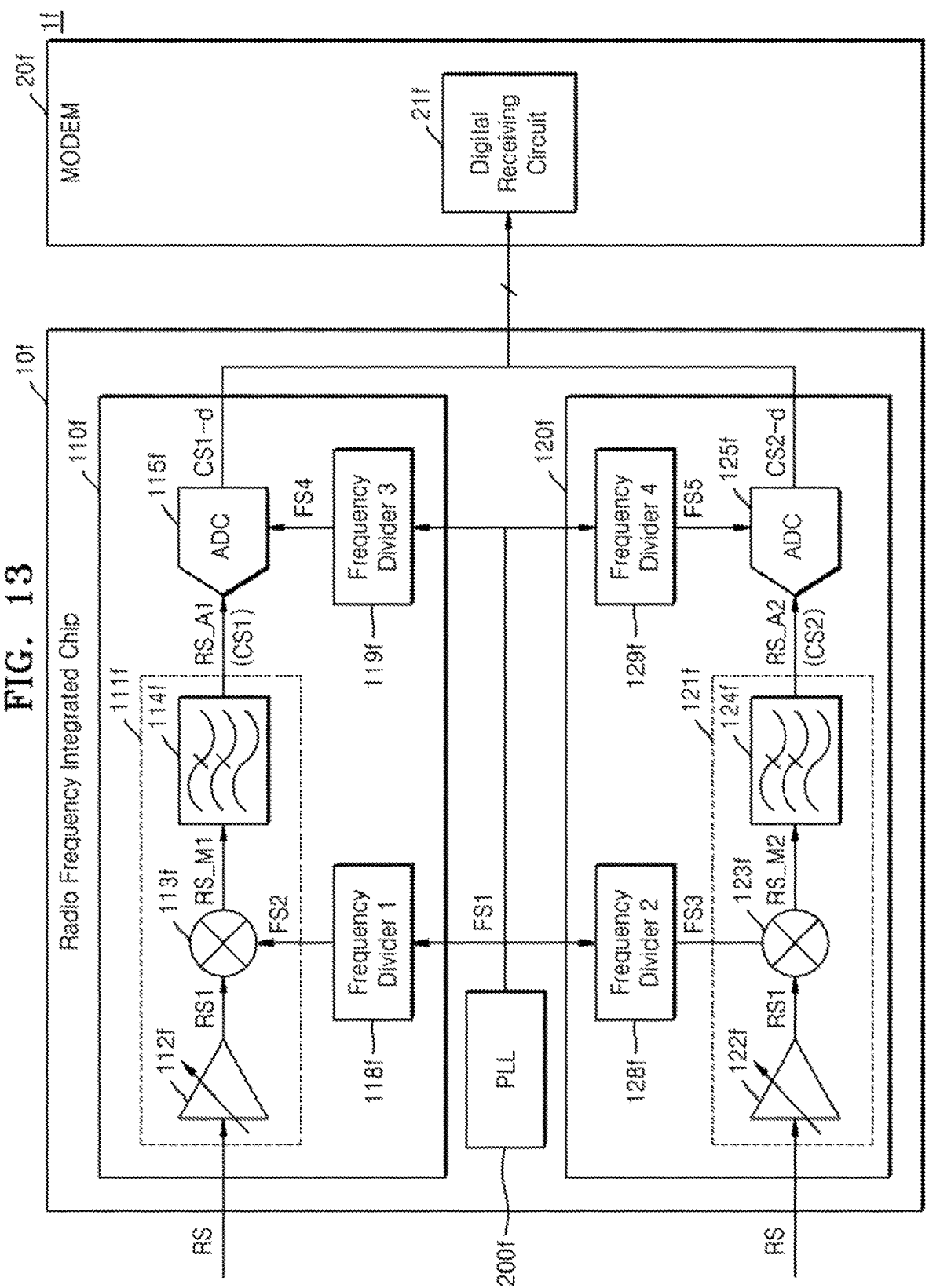
FIG. 13 is a block diagram of a wireless communication device according to an example embodiment.

FIG. 13 is a block diagram of a wireless communication device, 1$f$, according to an example embodiment. Redundant descriptions with respect to FIG. 12 will be omitted. The wireless communication device 1$f$ may include an RFIC 10$f$ and a MODEM 20$f$. In this example, MODEM 20$f$ may include a digital receiving circuit 21$f$ which may perform demodulation of digital carrier signals CS1-$d$, CS2-$d$ provided by RFIC 10$f$ in a form suitable for direct demodulation.

The RFIC 10*f* may include a first carrier receiver 110*f*, a second carrier receiver 120*f*, and PLL 200*f*, and the MODEM 20*f* may include a digital receiving circuit 21*f*. The first carrier receiver 110*f* may include a first analog receiving circuit 111*f*, a first ADC 115*f*, a first frequency divider 118*f*, and a third frequency divider 119*f*. The second carrier receiver 120*f* may include a second analog receiving circuit 1211, a second ADC 125*f*, a second frequency divider 1281 and a fourth frequency divider 129*f*. In addition, the first analog receiving circuit 111*f* may include a first receiving amplifier 112*f*, a first analog receiving mixer 113*f*, and a first an log receiving filter 114*f*. The second analog receiving circuit 121*f* may include a second receiving amplifier 122*f*, a second analog receiving mixer 123*f*, and a second analog receiving filter 124*f*.

In the embodiment shown in FIG. 13, a first carrier signal CS1 and a second carrier signal CS2 within carrier aggregated receive signal RS may be signals that, are filtered by the first analog receiving filter 114*f* car the second analog receiving filter 1241*f*. After such filtering, analog filtered signals RS_A1 and RS_A2 may be composed mainly of carrier signals CS1 and CS2, respectively. Signals RS_A1 and RS_A2 are A/D converted into digital carrier signals CS1-*d*, CS2-*d* by ADCs 115*f* and 12*f*, respectively. In an example, the digital receiving circuit 21*f* may directly demodulate signals CS1-*d* and CS2-*d*, as noted above. Alternatively, the digital receiving circuit 21*f* include at least one digital mixer to digitally translate frequencies of the signals CS1-*d* and CS2-*d* in a digital domain prior to the demodulation that recovers the original data, tin this case, modem processing circuit 27 may be part of digital receiving circuit 21*f*.) Note that the digital signals CS1-*d* and CS2-*d* may be provided on individual signal paths to MODEM 20*f*.

Figure 14:
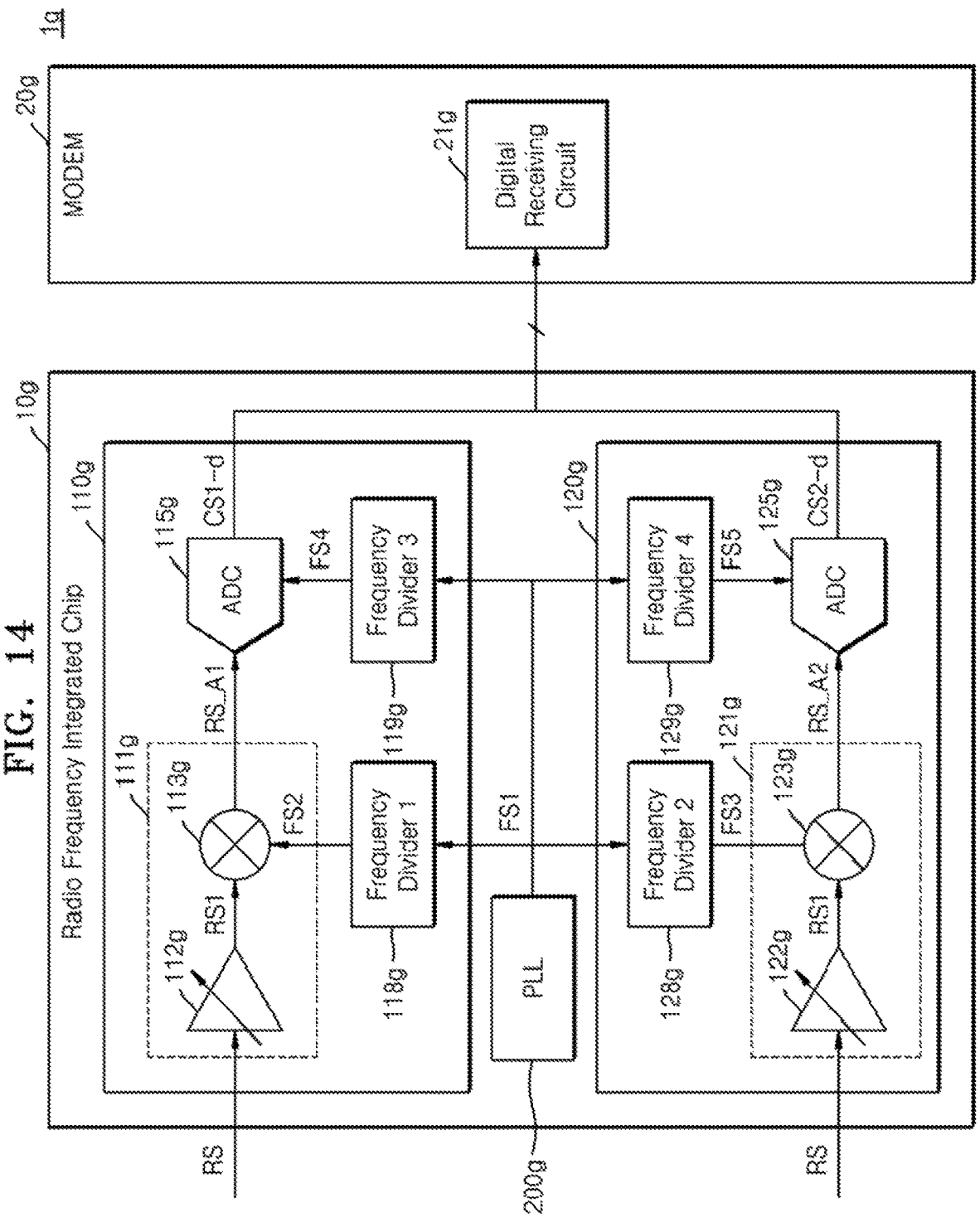
FIG. 14 is a block diagram of a wireless communication device according to an example embodiment.

FIG. 14 is a block diagram of a wireless communication device, 1*g*, according to an example embodiment. Redundant descriptions with respect to FIG. 13 will be omitted.

Referring to FIG. 14, the wireless communication device 1*g* may include an RFIC 10*g* and a MODEM 20*g*. Also, the RFIC 10*g* may include a first carrier receiver 110*g*, a second carrier receiver 120*g*, and a PLL 200*g* and the MODEM 20*g* may include a digital receiving circuit 21*g*. The first carrier receiver 110*g* may include a first analog receiving circuit 111*g* a first ADC 115*g*, a first frequency divider 118*g*, and a third frequency divider 119*g*. The second carrier receiver 120*g* may include a second analog receiving circuit 121*g*, a second ADC 125*g*, a second frequency divider 128*g*, and a fourth frequency divider 129*g*. In addition, the first analog receiving circuit 111*g* may include a first receiving amplifier 112*g* and a first analog receiving mixer 113*g*, and the second analog receiving circuit 121*g* may include a second receiving amplifier 122*g* and a second analog receiving mixer 123*g*.

In device 1*g*, a first digital carrier signal CS1-*d* and a second carrier signal CS2-*d* may be unfiltered signals. The digital receiving circuit 21*g* may include at least one digital mixer and at least one digital filter. The at least one digital filter may filter the first digital carrier signal CS1-*d* and the second digital carrier signal CS2, and the at least one digital mixer may translate frequencies of the first carrier signal CS1 and the second carrier signal CS2 in a digital domain.

Figure 15:
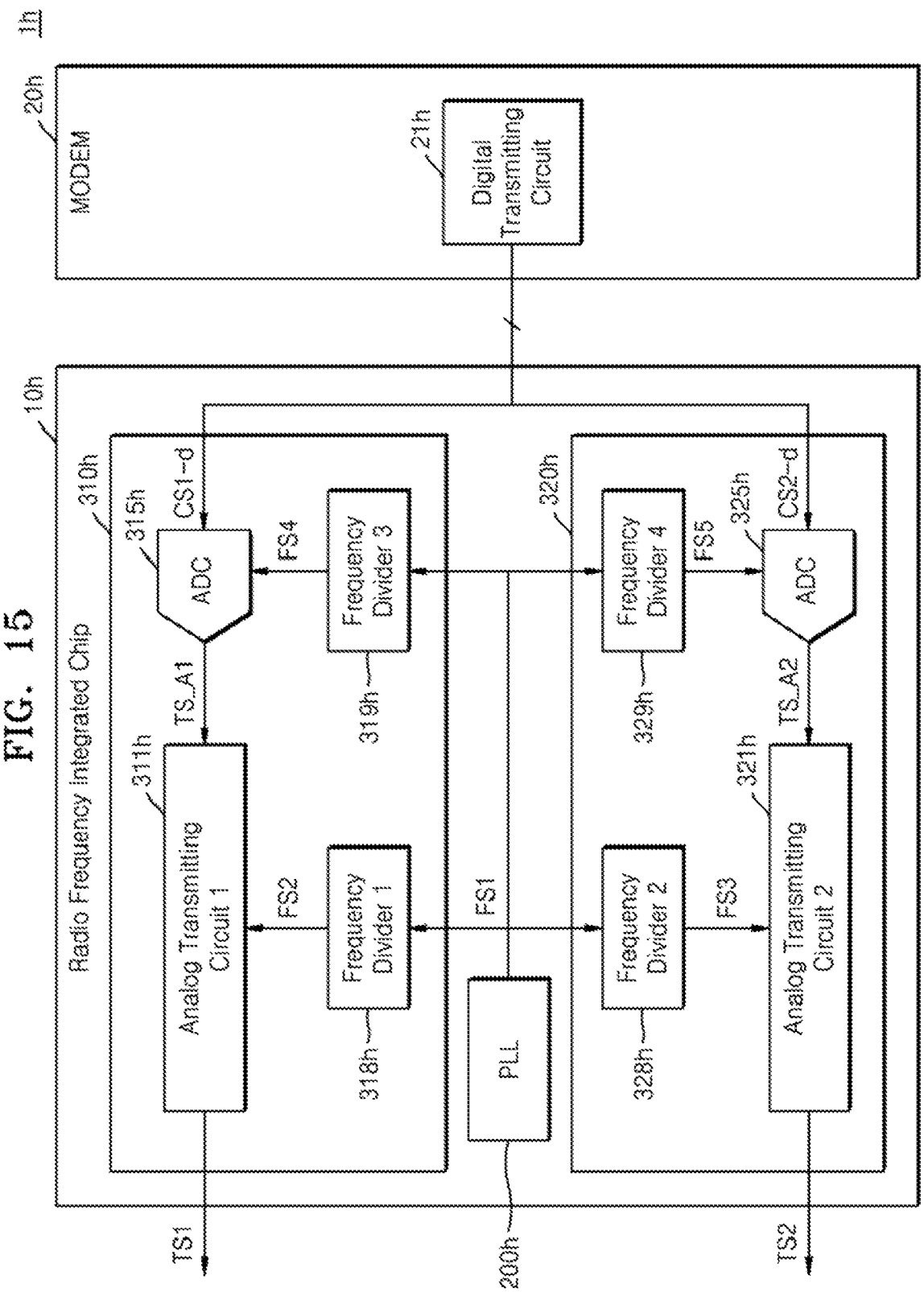
FIG. 15 is a block diagram of a wireless communication device according to an example embodiment.

FIG. 15 is a block diagram of a wireless communication device 1*h* according to an example embodiment. Redundant description with respect to FIG. 9 will be omitted. The wireless communication device 1*h* may, include an RFIC 10*h* and a MODEM 20*h*. Also, the RFIC 10*h* may include a first carrier transmitter 310*h*, a second carrier transmitter 320*h*, and a PLL 200*h*, and the MODEM 20*h* may include a digital transmitting circuit 21*h*. The first carrier transmitter 31011 may include a first analog transmitting circuit 311*h*, a first ADC 315*h*, a first frequency divider 318*h*, and a third frequency divider 319*h*. The second carrier transmitter 320*h* may include a second analog transmitting circuit 321*h*, a second ADC 325*h*, a second frequency divider 328*h*, and a fourth frequency divider 329*h*.

Unlike the embodiment shown in FIG. 9, the digital transmitting circuit 21*h* of device 1*h* may be located in the MODEM 20*h*. The digital transmitting circuit 21*h* may process (e.g., mix or filter) carrier signals in a digital region and output the processed first and second carrier signals CS1-*d* and CS2-*d*.

Figure 16:
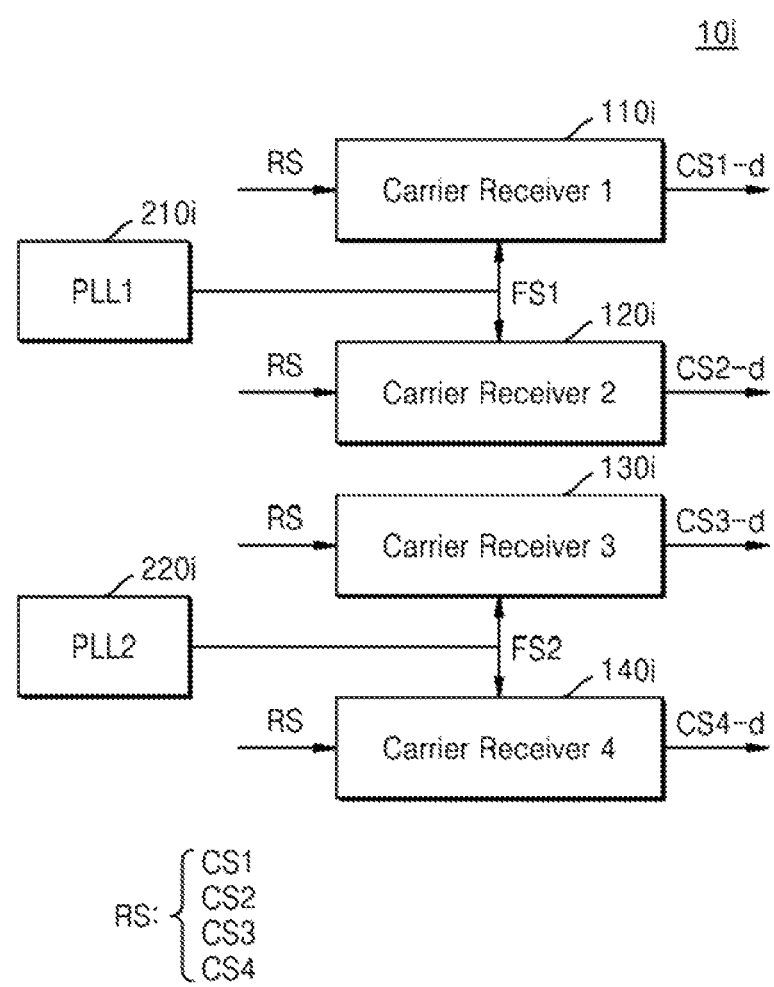

FIG. 16 is a block diagram of an RFIC, 10*i*, according to an example embodiment. Redundant description with respect to FIG. 1 will be omitted. The RFIC 10*i* may include a first carrier receiver 110*i*, a second carrier receiver 120*i*, a third carrier receiver 130*i*, a fourth carrier receiver 140*i*, a first PLL 210*i*, and a second PLL 220*i*.

The first PLL 210*i* may output a first frequency signal FS1 having a first frequency to the first carrier receiver 110*i* and the second carrier receiver 120*i*. The second PLL 220*i* may output a second frequency signal FS2 having a second frequency to the third carrier receiver 130*i* and the fourth carrier receiver 140*i*.

The first carrier receiver 110*i* may sample a first carrier signal CS1 from a receiving signal RS using a frequency signal generated based on the first frequency signal FS1 to generate digital carrier signal CS1-*d*. The second carrier receiver 120*i* may sample a second carrier signal CS2 from the receiving signal RS using the frequency signal generated based on the first frequency signal FS1 to generate digital carrier signal CS2-*d*. The third carrier receiver 300 may sample a third carrier signal CS3 from the receiving signal RS using a frequency signal generated based on the second frequency signal FS2 to generate digital carrier signal CS3-*d*. The fourth carrier receiver 140*i* may sample a fourth carrier signal CS4 from the receiving signal RS using the frequency signal generated based on the second frequency signal FS2 to generate digital carrier signal CS4-*d*.

Although FIG. 16 illustrates RFIC including a plurality of carrier receivers, the inventive concept of FIG. 16 may be also applied to a plurality of carrier transmitters.

Figure 17:
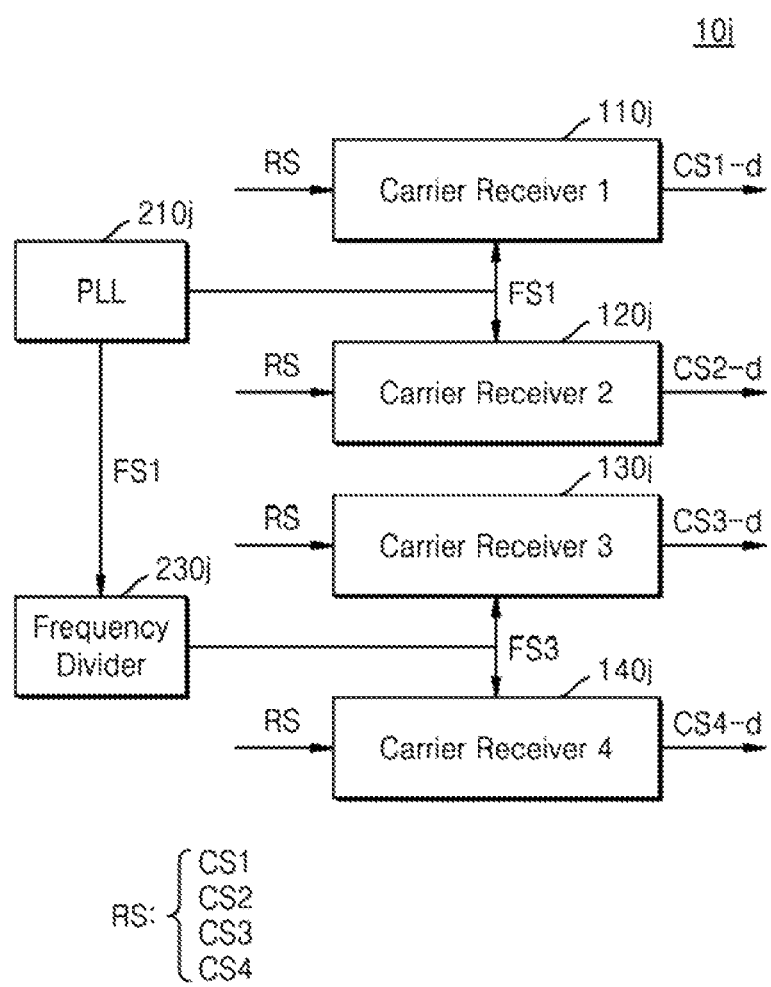
FIG. 17 is a block diagram of an RFIC according to an example embodiment.

FIG. 17 is a block diagram of an RFIC, 10*j*, according to an example embodiment. Redundant description with respect to FIG. 1 will be omitted. The RFIC 10*j* may include a first carrier receiver 110*j* a second carrier receiver 120*j*, a third carrier receiver 130*j*, a fourth carrier receiver 140*j*, a PLL 210*j*, and a frequency divider 230*j*.

The PLL 210*j* may output a first frequency signal FS1 having a first frequency to the frequency divider 230*j*, the first carrier receiver 110*j*, and the second carrier receiver 120*j*. The frequency divider 230*j* may output a third frequency signal FS3 having a third frequency to the third carrier receiver 130*j* and the fourth carrier receiver 140*j* based on the first frequency signal FS1 received from the PLL 210*j*.

The first carrier receiver 110*j* may sample a first carrier signal CS1 from a receiving signal RS using a frequency signal generated based on the first frequency signal FS1 to generate a digital carrier signal CS1-*d*. The second carrier receiver 120*j* may sample a second carrier signal CS2 from the receiving signal RS using the frequency signal generated based on the first frequency signal FS1 to generate a digital carrier signal CS2-*d*. The third carrier receiver 130*j* may sample a third carrier signal CS3 from the receiving signal RS using a frequency signal generated based on the second frequency signal FS2 to generate a digital carrier signal CS3-*d*. The fourth carrier receiver 140*j* may sample a fourth carrier signal CS4 from the receiving signal RS using the frequency signal generated based on the second frequency signal FS2 to generate a digital carrier signal CS4-*d*.

Although FIG. 17 illustrates an RFIC including a plurality of carrier receivers, the inventive concept of FIG. 17 may be also applied to a plurality of carrier transmitters.

Figure 18:
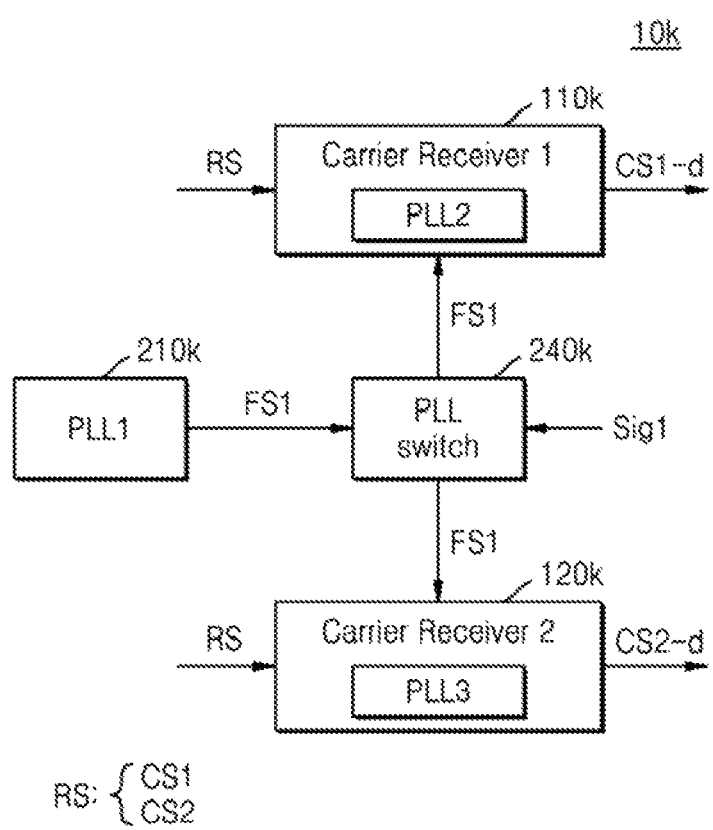
FIG. 18 is a block diagram of an RFIC according to an example embodiment.

FIG. 18 is a block diagram of an RFIC, 10*k*, according to an example embodiment. Redundant description with respect to FIG. 1 will be omitted. The RFIC 10*k* may include a first carrier receiver 110*k*, a second carrier receiver 120*k*, a first PLL 210*k*, and a switch 240*k*. Also, the first carrier receiver 110*k* may include a second PLL PLL2, and the second carrier receiver 120*k* may include a third PLL PLL3.

The first PLL 210*k* may output a first frequency signal FS1 having a first frequency to the PLL switch 240*k*. The PLL switch 240*k* may output the first frequency signal FS1 to the first carrier receiver 110*k* and the second carrier receiver 120*k* based on a first signal Sig1.

In an embodiment in which the PLL switch 240*k* outputs the first frequency signal FS1 to the first carrier receiver 110*k* and the second carrier receiver 120*k* based on the first signal Sig1, the first carrier receiver 110*k* and the second carrier receiver 120*k* may sample carrier signals CS1 and CS2 from a receiving signal RS using a frequency signal generated based on the first frequency signal FS1, to generate digital carrier signals CS1-*d* and CS2-*d*, respectively.

In an embodiment in which the PLL switch 240*k* outputs the first frequency signal FS1 only to the first carrier receiver 110*k* based on the first signal Sig1, the first carrier receiver 110*k* may sample a first carrier signal CS1 from a receiving signal RS using a frequency signal generated based on the first frequency signal FS1, and the second carrier receiver 120*k* may sample a second carrier signal CS2 from the receiving signal RS using a frequency signal generated by the third PLL PLL3, to generate digital carrier signals CS1-*d*, CS2-*d*.

In an embodiment in which the PLL switch 240*k* does not output the first frequency signal FS1 to the first carrier receiver 110*k* and the second carrier receiver 120*k* based on the first signal Sig1, the first carrier receiver 110*k* may sample a first carrier signal CS1 from a receiving signal RS using a frequency signal generated by the second PLL PLL2, and the second carrier receiver 120*k* may sample a second carrier signal CS2 from the receiving signal RS using a frequency signal generated by the third PLL PLL3. Although FIG. 18 illustrates an RFIC including a plurality of carrier receivers, the inventive concept may be also implied in a similar manner to a plurality of carrier transmitters.

Figure 19:
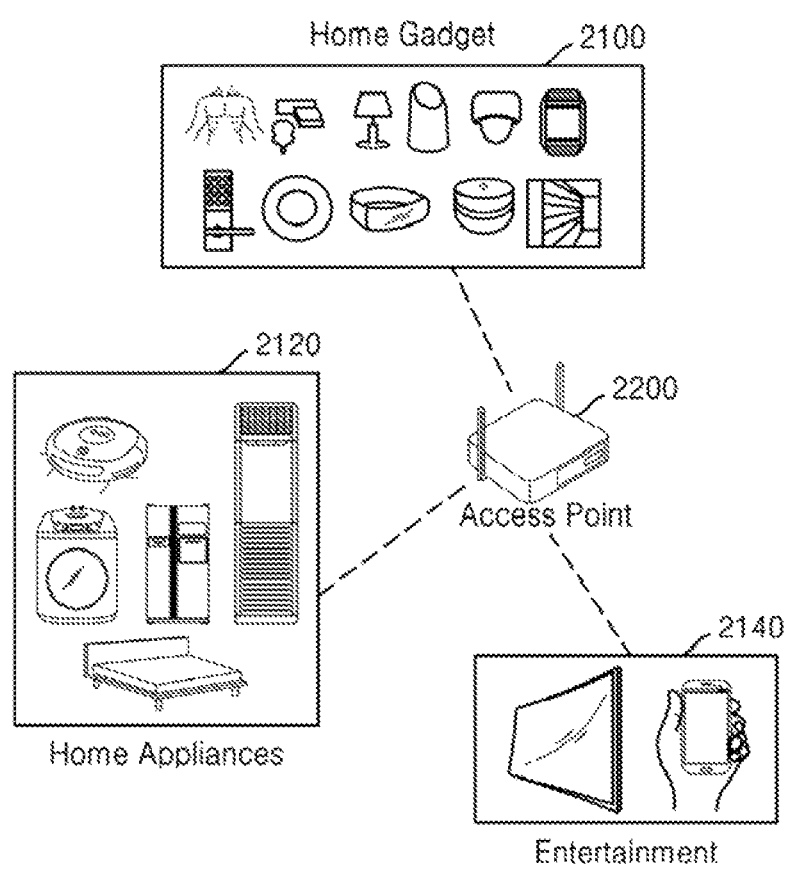
FIG. 19 is a diagram of a wireless communication system including various wireless communication equipment according to an example embodiment.

FIG. 19 is a diagram of a wireless communication system including various wireless communication equipment according to an example embodiment. In the example system, each of a home gadget 2100, a home appliance 2120, entertainment equipment 2140, and an AP 2200 may include a wireless communication device for transmitting/receiving carrier aggregated signals according to an example embodiment. In some embodiments, the home gadget 2100, the home appliance 2120, the entertainment equipment 2140, and the AP 2200 may together constitute an Internet of Things (IoT) network system. The items of communication equipment shown in FIG. 19 are only examples, and it will be understood that a wireless communication device according, to an example embodiment may be included in other types of communication equipment.

The home gadget 2100, the home appliance 2120, the entertainment equipment 2140, and the AP 2200 may transmit receive carrier aggregated signals using the wireless communication devices according to the above-described example embodiments. In an embodiment, the home gadget 2100, the home appliance 2120, the entertainment equipment 2140, and the AP 2200 may include a plurality of carrier transmitters and or a plurality of carrier receivers configured to share a PLL with each other. Thus, area and power consumption of the respective wireless communication devices included in the home gadget 2100, the home appliance 2120, the entertainment equipment 2140, and the AP 2200 may be reduced.

Typical example embodiments of the inventive concept are disclosed in the above description and the drawings. Although specific terms are employed, they are used in a generic and descriptive sense only, and not for purposes of limitation. It will be understood by one of ordinary skill in the art that various changes in form and details may be made to the disclosed embodiments without departing from the spirit and scope of the inventive concept as defined by the following claims.

What is claimed is:

1. A radio-frequency integrated chip configured to receive a receiving signal composed of at least first and second carrier signals, the radio-frequency integrated chip comprising:
   a first carrier receiver configured to receive a first portion of the receiving signal and generate therefrom a first digital carrier signal corresponding to the first carrier signal, the first carrier receiver comprising a first analog mixer configured to translate frequencies of the first carrier signal in an analog domain and a first digital mixer configured to further translate frequencies of the first carrier signal in a digital domain and output the first digital carrier signal;
   a second carrier receiver configured to receive a second portion of the receiving signal and generate therefrom a second digital carrier signal corresponding to the second carrier signal, the second carrier receiver comprising a second analog mixer configured to translate frequencies of the second carrier signal in the analog domain and a second digital mixer configured to further translate frequencies of the second carrier signal in the digital domain and output the second digital carrier signal; and
   a phase-locked loop (PLL) configured to output a first frequency signal having a first frequency to the first carrier receiver and the second carrier receiver,
   wherein the first analog mixer translates the frequencies of the first carrier signal based on a second frequency signal generated by dividing the first frequency signal, and the second analog mixer translates the frequencies of the second carrier signal based on a third frequency signal generated by dividing the first frequency signal.

2. The radio-frequency integrated chip of claim 1, wherein the first carrier receiver further comprises a first frequency divider configured to divide the first frequency signal and thereby generate the second frequency signal having a second frequency, and output the generated second frequency signal to the first analog mixer,
   the second carrier receiver further comprises a second frequency divider configured to divide the first frequency signal and thereby generate the third frequency signal having a third frequency, and output the generated third frequency signal to the second analog mixer, and
   the first analog mixer down-converts frequencies of the first portion of the receiving signal based on the second frequency signal and generates a first mixed receiving signal, and the second analog mixer down-converts the frequencies of the second portion of the receiving signal based on the third frequency signal and generates a second mixed receiving signal.

3. The radio-frequency integrated chip of claim 2, wherein the first carrier receiver further comprises a third frequency divider configured to divide the first frequency signal and generate a fourth frequency signal having a fourth frequency different from the second frequency and outputs the second frequency signal or the fourth frequency signal to the first analog mixer based on a first frequency selection signal, and the second carrier receiver further comprises a fourth frequency divider configured to divide the first frequency signal and generate a fifth frequency signal having a fifth frequency different from the third frequency and outputs the third frequency signal or the fifth frequency signal to the second analog mixer based on a second frequency selection signal.

4. The radio-frequency integrated chip of claim 2, wherein the first carrier receiver further comprises a first analog filter configured to filter the first mixed receiving signal outside a first predetermined band and generate a first analog receiving signal, and the second carrier receiver further comprises a second analog filter configured to filter the second mixed receiving signal outside a second predetermined band and generate a second analog receiving signal.

5. The radio-frequency integrated chip of claim 4, wherein the first carrier receiver further comprises a first analog-to-digital converter (ADC) configured to analog-to-digital convert the first analog receiving signal and thereby generate a first digital receiving signal, and the second carrier receiver further comprises a second ADC configured to analog-to-digital convert the second analog receiving signal and thereby generate a second digital receiving signal.

6. The radio-frequency integrated chip of claim 5, wherein at least one of the first ADC and the second ADC samples the first analog receiving signal or the second analog receiving signal based on a frequency signal generated by dividing the first frequency signal received from the PLL, to generate the first digital receiving signal or the second digital receiving signal.

7. The radio-frequency integrated chip of claim 5, wherein the first carrier receiver further comprises a third frequency divider configured to divide the first frequency signal, generate a fourth frequency signal having a fourth frequency, and output the generated fourth frequency signal to the first ADC, the second carrier receiver further comprises a fourth frequency divider configured to divide the first frequency signal, generate a fifth frequency signal having a fifth frequency, and output the generated fifth frequency signal to the second ADC, and the first ADC generates the first digital receiving signal based on the fourth frequency signal, and the second ADC generates the second digital receiving signal based on the fifth frequency signal.

8. The radio-frequency integrated chip of claim 5, further comprising:

a first digital receiving mixer configured to receives the first digital receiving signal, down-converts frequencies of the first digital receiving signal, and thereby generates and output the first digital carrier signal, and a second digital receiving mixer configured to receives the second digital receiving signal, down-converts frequencies of the second digital receiving signal, and thereby generate and output the second digital carrier signal.

9. The radio-frequency integrated chip of claim 1, wherein the first carrier receiver further comprises a first receiving amplifier configured to amplify the first portion of the receiving signal and output the amplified first receiving signal, the second carrier receiver further comprises a second receiving amplifier configured to amplify the second portion of the receiving signal and output the amplified second receiving signal.

10. The radio-frequency integrated chip of claim 1, wherein the first analog mixer down-converts frequencies of the first portion of the receiving signal and thereby generates a first mixed receiving signal, the second analog mixer down-converts frequencies of the second portion of the receiving signal and thereby generates a second mixed receiving signal, the first carrier receiver further comprises a first analog-to-digital converter (ADC) configured to generate a first digital receiving signal based on the first mixed receiving signal and a first digital receiving filter configured to filter the first digital receiving signal outside a first predetermined band and thereby generate a third digital receiving signal, the second carrier receiver further comprises a second ADC configured to generate a second digital receiving signal based on the second mixed receiving signal and a second digital receiving filter configured to filter the second digital receiving signal outside a second predetermined band and thereby generate a fourth digital receiving signal, and the first digital receiving mixer down-converts frequencies of the third digital receiving signal and thereby generates the first digital carrier signal, and the second digital receiving mixer down-converts frequencies of the fourth digital receiving signal and thereby generates the second digital carrier signal.

11. The radio-frequency integrated chip of claim 1, further comprising a first carrier transmitter comprising a first analog transmitting mixer, the first carrier transmitter being configured to generate a first transmitting signal having a third carrier signal, wherein the first analog transmitting mixer up-converts frequencies of the third carrier signal using a fourth frequency signal generated by dividing the first frequency signal received from the PLL.

12. The radio-frequency integrated chip of claim 1, further comprising a phase-locked loop (PLL) switch configured to selectively output the first frequency signal received from the PLL to at least one of the first carrier receiver and the second carrier receiver based on a control signal.

13. The radio-frequency integrated chip of claim 1, further comprising a signal divider for receiving the receiving signal from an antenna and dividing the receiving signal into the first and second portions of the receiving signal, which are provided to the first and second carrier receivers, respectively.

14. The radio-frequency integrated chip of claim 1, wherein the second frequency signal has a second, fixed frequency, the third frequency signal has a third, fixed frequency different from the second frequency, the first analog mixer translates the frequency band of the first carrier signal by the second frequency, and the second analog mixer translates the frequency band of the second carrier signal by the third frequency.

15. The radio-frequency integrated chip of claim 1, the first analog mixer translates the frequencies of the first carrier signal by a coarse frequency offset and the first digital mixer translates the frequencies of the first carrier signal by a fine frequency offset less than the coarse frequency offset.

16. A radio-frequency integrated chip configured to transmit a carrier aggregated signal, the radio-frequency integrated chip comprising:
  a first carrier transmitter configured to receive a first digital carrier signal and generate therefrom a first transmitting signal, the first carrier transmitter comprising a first digital mixer configured to translate frequencies of the first digital carrier signal in a digital domain, and a first analog mixer configured to translate frequencies of a first analog carrier signal, derived from the first digital carrier signal, in an analog domain;
  a second carrier transmitter configured to receive a second digital carrier signal and generate therefrom a second transmitting signal, the second carrier transmitter comprising a second digital mixer configured to translate frequencies of the second digital carrier signal in the digital domain, and a second analog mixer configured to translate frequencies of a second analog carrier signal, derived from the second digital carrier signal, in the analog domain; and
  a phase-locked loop (PLL) configured to output a first frequency signal having a first frequency to the first carrier transmitter and the second carrier transmitter,
  wherein the first analog mixer up-converts the frequencies of the first analog carrier signal based on a second frequency signal generated by dividing the first frequency signal, and the second analog mixer up-converts the frequencies of the second analog carrier signal based on a third frequency signal generated by dividing the first frequency signal.

17. The radio-frequency integrated chip of claim 16, wherein the first digital transmitting mixer up-converts a frequency band of the first digital carrier signal and thereby generates a first digital transmitting signal,
  the second digital transmitting mixer up-converts a frequency band of the second digital carrier signal and thereby generates a second digital transmitting signal,
  the first carrier transmitter comprises a first digital-to-analog converter (DAC) configured to generate a first analog transmitting signal based on the first digital transmitting signal and a first analog filter configured to filter the first analog transmitting signal outside a first predetermined band, and
  the second carrier transmitter comprises a second DAC configured to generate a second analog transmitting signal based on the second digital transmitting signal and a second analog transmitting filter configured to filter the second analog transmitting signal outside a second predetermined band.

18. The radio-frequency integrated chip of claim 16, wherein the first carrier transmitter further comprises a first frequency divider configured to divide the first frequency signal, generate the second frequency signal having a second frequency, and output the generated second frequency signal to the first analog mixer,
  the second carrier transmitter further comprises a second frequency divider configured to divide the first frequency signal, generate the third frequency signal having a third frequency, and output the third frequency signal to the second analog mixer, and
  the first analog mixer up-converts frequencies of the first transmitting signal based on the second frequency signal, and the second analog mixer up-converts frequencies of the second transmitting signal based on the third frequency signal.

19. A wireless communication device configured to receive a receive signal composed of at least first and second carrier signals, the wireless communication device comprising:
  a radio-frequency integrated chip comprising a first carrier receiver configured to receive a first portion of the receive signal and generate therefrom a first digital carrier signal corresponding to the first carrier signal, a second carrier receiver configured to receive a second portion of the receive signal and generate therefrom a second digital carrier signal corresponding to the second carrier signal, and a phase-locked loop (PLL) configured to output a first frequency signal having a first frequency to the first carrier receiver and the second carrier receiver; and
  a modulator-demodulator (MODEM) configured to down-convert frequencies of the first digital carrier signal and the second digital carrier signal in a digital domain to provide down-converted first and second digital carrier signals, and demodulate the first and second down-converted digital carrier signals,
  wherein the first carrier receiver comprises a first analog mixer configured to down-convert frequencies of the receive signal based on a second frequency signal generated by dividing the first frequency signal, and the second carrier receiver comprises a second analog mixer configured to down-convert the frequencies of the receive signal based on a third frequency signal generated by dividing the first frequency signal.

20. The wireless communication device of claim 19, wherein the first carrier receiver further comprises a first frequency divider configured to divide the first frequency signal, generate the second frequency signal having a second frequency, and output the generated second frequency signal to the first analog mixer,
  the second carrier receiver further comprises a second frequency divider configured to divide the first frequency signal, generate the third frequency signal having a third frequency, and output the generated third frequency signal to the second analog mixer, and
  the first analog mixer down-converts frequencies of the receive signal based on the second frequency signal and thereby generates a first mixed receiving signal, and the second analog mixer down-converts frequencies of the receive signal based on the third frequency signal and thereby generates a second mixed receiving signal.

* * * * *